United States Patent
Kim et al.

(10) Patent No.: US 12,199,639 B2
(45) Date of Patent: Jan. 14, 2025

(54) ENCODING TECHNIQUE FOR HARQ OPERATION

(71) Applicant: LG Electronics Inc., Seoul (KR)

(72) Inventors: Jinmin Kim, Seoul (KR); Jinsoo Choi, Seoul (KR); Dongguk Lim, Seoul (KR); Eunsung Park, Seoul (KR)

(73) Assignee: LG Electronics Inc., Seoul (KR)

( * ) Notice: Subject to any disclaimer, the term of this patent is extended or adjusted under 35 U.S.C. 154(b) by 396 days.

(21) Appl. No.: 17/635,310

(22) PCT Filed: Aug. 14, 2020

(86) PCT No.: PCT/KR2020/010848
§ 371 (c)(1),
(2) Date: Feb. 14, 2022

(87) PCT Pub. No.: WO2021/029731
PCT Pub. Date: Feb. 18, 2021

(65) Prior Publication Data
US 2022/0337270 A1    Oct. 20, 2022

(30) Foreign Application Priority Data

Aug. 14, 2019 (KR) .................. 10-2019-0099765
Aug. 20, 2019 (KR) .................. 10-2019-0101939

(51) Int. Cl.
*H03M 13/25* (2006.01)
*H04L 1/00* (2006.01)

(52) U.S. Cl.
CPC ....... *H03M 13/251* (2013.01); *H03M 13/255* (2013.01); *H04L 1/0061* (2013.01)

(58) Field of Classification Search
CPC .. H03M 13/251; H03M 13/255; H04L 1/0061
See application file for complete search history.

(56) References Cited

U.S. PATENT DOCUMENTS

| | | | |
|---|---|---|---|
| 2004/0153952 A1* | 8/2004 | Sharma | H04L 1/08 714/781 |
| 2008/0171543 A1* | 7/2008 | Tran | H04L 1/201 455/424 |
| 2014/0056223 A1* | 2/2014 | Quan | H04W 28/18 370/328 |

(Continued)

FOREIGN PATENT DOCUMENTS

| KR | 20180103889 | * 9/2018 |
|---|---|---|
| KR | 1020180103889 | 9/2018 |
| WO | WO2018189332 | 10/2018 |

OTHER PUBLICATIONS

Samsung, "Discussion on HARQ," IEEE 802.11-19/1172r0, Jul. 15, 2019, 12 pages.

(Continued)

*Primary Examiner* — Mewale A Ambaye
(74) *Attorney, Agent, or Firm* — Fish & Richardson P.C.

(57) ABSTRACT

A transmission station (STA) of a wireless local area network system may configure a plurality of blocks for encoding. The plurality of blocks may each include a data block and a CRC block for detecting an error of the data block. The transmission STA encodes each of the plurality of blocks and may transmit the plurality of encoded blocks.

17 Claims, 35 Drawing Sheets

(56) References Cited

U.S. PATENT DOCUMENTS

2017/0180076 A1* 6/2017 Finlow-Bates ....... H04L 1/0083
2017/0230141 A1* 8/2017 Jeong ................... H04L 1/0057

OTHER PUBLICATIONS

LG Electronics, "Consideration on HARQ Unit," IEEE 802.11-19/1131r0, Jul. 15, 2019, 18 pages.
Quantenna Communications, "HARQ Framing," IEEE 802.11-19/0873r1, Jul. 14, 2019, 22 pages.
Samsung, "Discussion on HARQ," IEEE 802.11-10/1172r0, Jul. 15, 2019, 12 pages.

* cited by examiner

FIG. 1
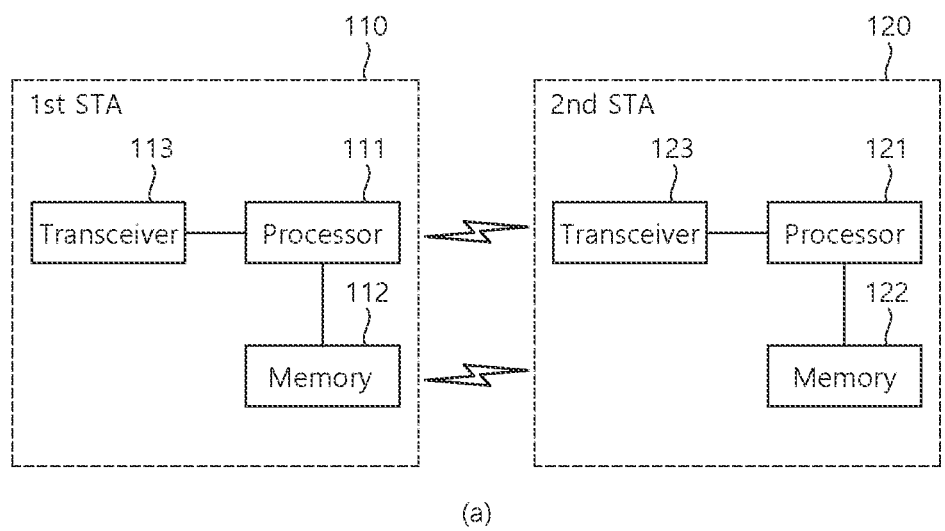
(a)
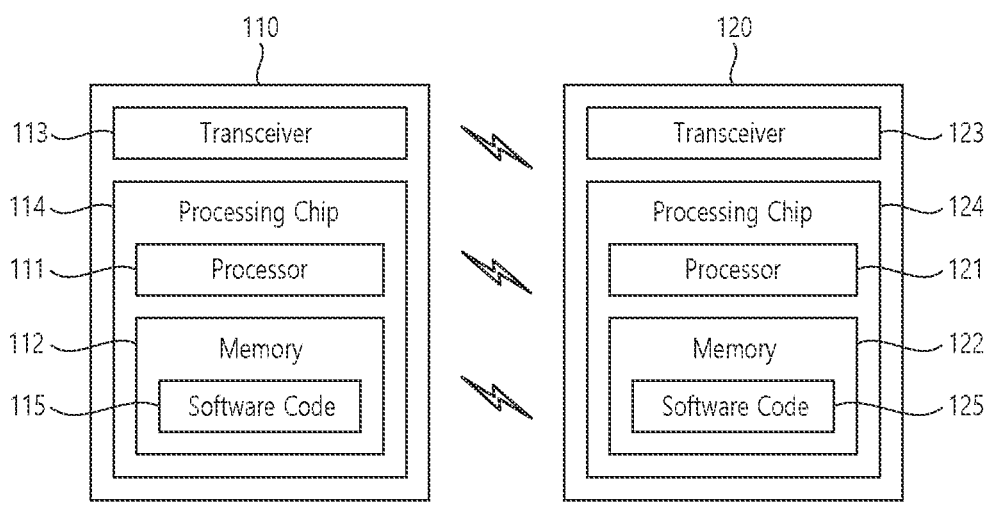
(b)

FIG. 2
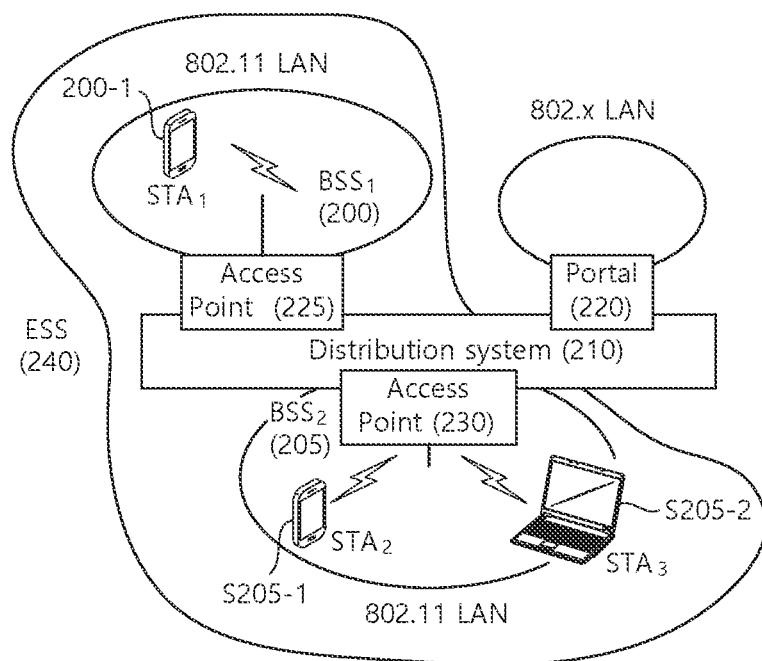
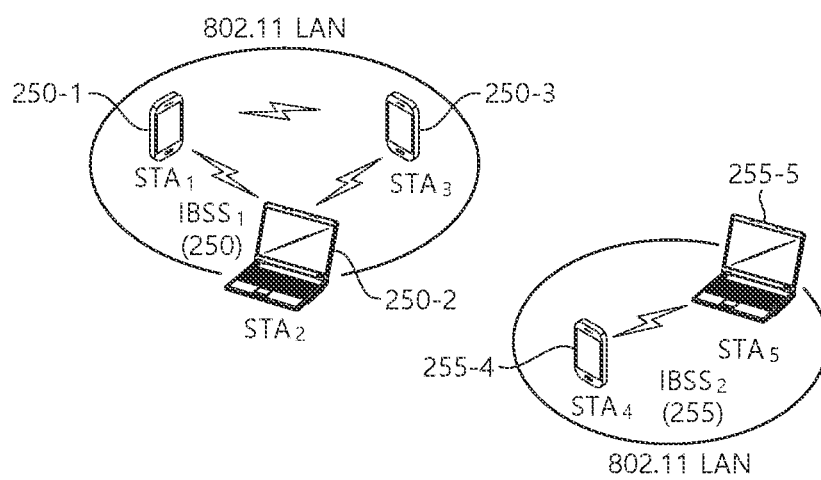

FIG. 4
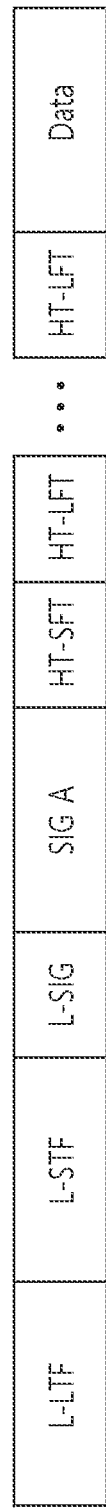
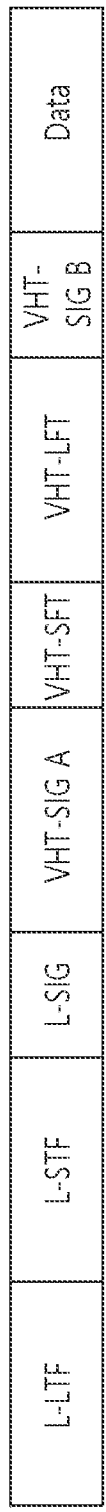
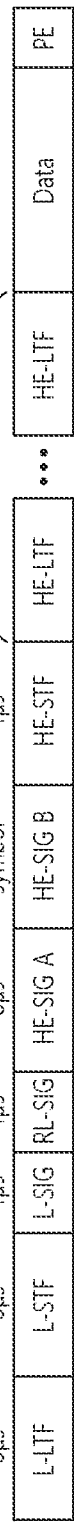

FIG. 18

| 8μs | 8μs | 4μs | 4μs | | | | | | |
|---|---|---|---|---|---|---|---|---|---|
| L-LTF | L-STF | L-SIG | RL-SIG | SIG A | SIG B | STF | LTF | Data | PE |

FIG. 29

$$P_0 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}$$

FIG. 30

$$P_1 = \begin{bmatrix} 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \\ 1 & 0 & 0 & 0 & 0 & 0 & 0 \end{bmatrix}$$

FIG. 31

$$P_5 = \begin{bmatrix} 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \end{bmatrix}$$

FIG. 32

```
Coding rate R=1/2
 0  -  -  -  0  0  -  -  0  -  -  0  1  0  -  -  -  -  -  -  -  -  -  -
22  0  -  - 17  -  0  0 12  -  -  -  -  0  0  -  -  -  -  -  -  -  -  -
 6  -  0  - 10  -  -  - 24  -  0  -  -  -  0  0  -  -  -  -  -  -  -  -
 2  -  -  0 20  -  -  - 25  0  -  -  -  -  -  0  0  -  -  -  -  -  -  -
23  -  -  -  3  -  -  -  0  -  9 11  -  -  -  -  0  0  -  -  -  -  -  -
24  - 23  1 17  -  3  - 10  -  -  -  -  -  -  -  -  0  0  -  -  -  -  -
25  -  -  -  8  -  -  7 18  -  -  0  -  -  -  -  -  -  0  0  -  -  -  -
13 24  -  -  0  -  8  -  6  -  -  -  -  -  -  -  -  -  -  0  0  -  -  -
 7 20  - 16 22 10  -  - 23  -  -  -  -  -  -  -  -  -  -  -  0  0  -  -
11  -  -  - 19  -  -  - 13  -  3 17  -  -  -  -  -  -  -  -  -  0  0  -
25  -  8  - 23 18  - 14  9  -  -  -  -  -  -  -  -  -  -  -  -  -  0  0
 3  -  -  - 16  -  -  2 25  5  -  -  1  -  -  -  -  -  -  -  -  -  -  0

Coding rate R=2/3
25 26 14  - 20  -  2  -  4  -  -  8  - 16  - 18  1  0  -  -  -  -  -  -
10  9 15 11  -  0  -  1  -  - 18  -  8  - 10  -  -  0  0  -  -  -  -  -
16  2 20 26 21  -  6  -  1 26  -  7  -  -  -  -  -  -  0  0  -  -  -  -
10 13  5  0  -  3  -  7  -  - 26  -  - 13  - 16  -  -  -  0  0  -  -  -
23 14 24  - 12  - 19  - 17  -  -  - 20  - 21  -  0  -  -  -  0  0  -  -
 6 22  9 20  - 25  - 17  -  8  - 14  - 18  -  -  -  -  -  -  -  0  0  -
14 23 21 11 20  - 24  - 18  - 19  -  -  -  - 22  -  -  -  -  -  -  0  0
17 11 11 20  - 21  - 26  -  3  -  - 18  - 26  -  1  -  -  -  -  -  -  0

Coding rate R=3/4
16 17 22 24  9  3 14  -  4  2  7  - 26  -  2  - 21  -  1  0  -  -  -  -
25 12 12  3  3 26  6 21  - 15 22  - 15  -  4  -  - 16  -  0  0  -  -  -
25 18 26 16 22 23  9  -  0  -  4  -  4  -  8 23 11  -  -  -  0  0  -  -
 9  7  0  1 17  -  -  7  3  -  3 23  - 16  -  - 21  -  0  -  -  0  0  -
24  5 26  7  1  -  - 15 24 15  -  8  - 13  - 13  - 11  -  -  -  -  0  0
 2  2 19 14 24  1 15 19  - 21  -  2  - 24  -  3  -  2  1  -  -  -  -  0

Coding rate R=5/6
17 13  8 21  9  3 18 12 10  0  4 15 19  2  5 10 26 19 13 13  1  0  -  -
 3 12 11 14 11 25  5 18  0  9  2 26 26 10 24  7 14 20  4  2  -  0  0  -
22 16  4  3 10 21 12  5 21 14 19  5  -  8  5 18 11  5  5 15  0  -  0  0
 7  7 14 14  4 16 16 24 24 10  1  7 15  6 10 26  8 18 21 14  1  -  -  0
```

ENCODING TECHNIQUE FOR HARQ OPERATION

CROSS-REFERENCE TO RELATED APPLICATIONS

This application is a National Stage application under 35 U.S.C. § 371 of International Application No. PCT/KR2020/010848, filed on Aug. 14, 2020, which claims the benefit of Korean Patent Application No. 10-2019-0099765, filed on Aug. 14, 2019 and Korean Patent Application No. 10-2019-0101939, filed on Aug. 20, 2019. The disclosures of the prior applications are incorporated by reference in their entirety.

BACKGROUND

Technical Field

The present specification relates to an encoding scheme for performing a hybrid automatic repeat request (HARQ) operation in a wireless local area network (WLAN) system.

Related Art

A wireless local area network (WLAN) has been enhanced in various ways. For example, the IEEE 802.11ax standard has proposed an enhanced communication environment by using orthogonal frequency division multiple access (OFDMA) and downlink multi-user multiple input multiple output (DL MU MIMO) schemes.

The present specification proposes a technical feature that can be utilized in a new communication standard. For example, the new communication standard may be an extreme high throughput (EHT) standard which is currently being discussed. The EHT standard may use an increased bandwidth, an enhanced PHY layer protocol data unit (PPDU) structure, an enhanced sequence, a hybrid automatic repeat request (HARQ) scheme, or the like, which is newly proposed. The EHT standard may be called the IEEE 802.11be standard.

The present disclosure proposes technical features that improve the legacy WLAN or that may be utilized in a new communication standard. For example, the new communication standard may be an extreme high throughput (EHT) standard which has lately been under discussion. The EHT standard may use a newly proposed increased bandwidth, an improved physical (PHY) protocol data unit (PPDU) structure, an improved sequence, a hybrid automatic repeat request (HARQ) technique, and a multi-link technique.

SUMMARY

Technical Objects

The EHT standard can use the HARQ scheme that checks whether the received data has no errors and requires retransmission when an error occurs. In order to use the HARQ scheme, a receiving STA supporting HARQ may attempt error correction on received data and determine whether to retransmit using an error detection code.

The transmitting STA may transmit a field (or block) for error detection together with data. In this case, when a field (or block) for error detection is included, the encoding method may be changed. Accordingly, when a field (or for example, CRC bits) for error detection is included by the transmitting STA, technical features for encoding may be required.

Technical Solutions

A method performed by a transmitting station (STA) in a wireless local area network (WLAN) system, according to various embodiments of the present disclosure, may include configuring a plurality of blocks, wherein the plurality of blocks include a first block and a second block, wherein a second block is contiguous to the first block, wherein the first block includes a first data block and a first CRC block, wherein the second block includes a second data block and a second CRC block; encoding each of the plurality of blocks; and transmitting the encoded plurality of blocks.

Technical Effects

According to the embodiments of the present specification, when encoding data, the transmitting STA may add CRC bits as a block for error detection. CRC bits may be added in units of HARQ units. Accordingly, the receiving STA has the effect of identifying an erroneous HARQ unit based on the CRC bits.

In addition, the transmitting STA may perform an encoding process after adding CRC bits. For example, the transmitting STA may perform LDPC encoding. As the transmitting STA encodes the CRC bits and data together, there is an effect of increasing data reliability.

BRIEF DESCRIPTION OF THE DRAWINGS

FIG. 1 shows an example of a transmitting apparatus and/or receiving apparatus of the present specification.

FIG. 2 is a conceptual view illustrating the structure of a wireless local area network (WLAN).

FIG. 4 illustrates an example of a PPDU used in an IEEE standard.

FIG. 18 illustrates an example of a PPDU used in the present specification.

FIGS. 29 to 31 show examples of sub-blocks constituting a parity check matrix.

FIG. 32 is a diagram for explaining an example of a parity check matrix.

DETAILED DESCRIPTION

Figure 3:
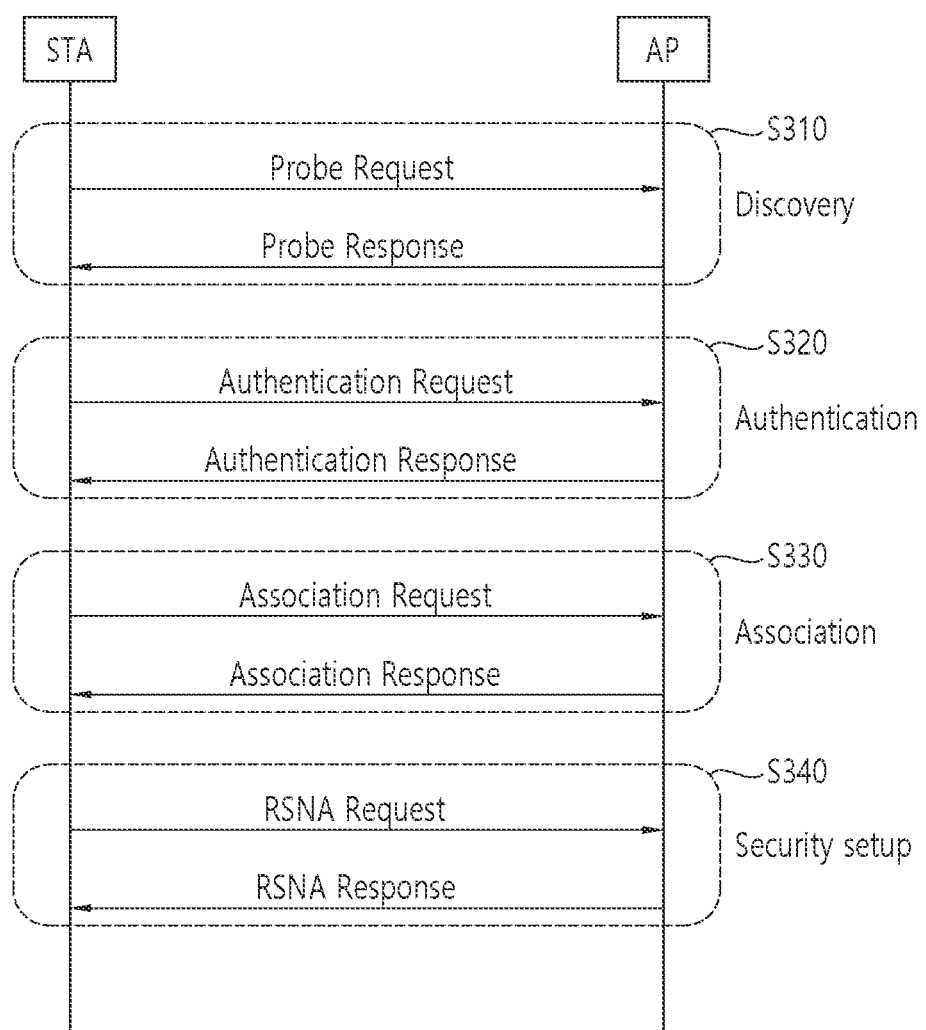
FIG. 3 illustrates a general link setup process.

In the present specification, "A or B" may mean "only A", "only B" or "both A and B". In other words, in the present specification, "A or B" may be interpreted as "A and/or B". For example, in the present specification, "A, B, or C" may mean "only A", "only B", "only C", or "any combination of A, B, C".

A slash (/) or comma used in the present specification may mean "and/or". For example, "A/B" may mean "A and/or B". Accordingly, "A/B" may mean "only A", "only B", or "both A and B". For example, "A, B, C" may mean "A, B, or C".

In the present specification, "at least one of A and B" may mean "only A", "only B", or "both A and B". In addition, in the present specification, the expression "at least one of A or B" or "at least one of A and/or B" may be interpreted as "at least one of A and B".

In addition, in the present specification, "at least one of A, B, and C" may mean "only A", "only B", "only C", or "any combination of A, B, and C". In addition, "at least one of A, B, or C" or "at least one of A, B, and/or C" may mean "at least one of A, B, and C".

In addition, a parenthesis used in the present specification may mean "for example". Specifically, when indicated as "control information (EHT-signal)", it may mean that "EHT-signal" is proposed as an example of the "control information". In other words, the "control information" of the present specification is not limited to "EHT-signal", and "EHT-signal" may be proposed as an example of the "control information". In addition, when indicated as "control information (i.e., EHT-signal)", it may also mean that "EHT-signal" is proposed as an example of the "control information".

Technical features described individually in one figure in the present specification may be individually implemented, or may be simultaneously implemented.

The following example of the present specification may be applied to various wireless communication systems. For example, the following example of the present specification may be applied to a wireless local area network (WLAN) system. For example, the present specification may be applied to the IEEE 802.11a/g/n/ac standard or the IEEE 802.11ax standard. In addition, the present specification may also be applied to the newly proposed EHT standard or IEEE 802.11be standard. In addition, the example of the present specification may also be applied to a new WLAN standard enhanced from the EHT standard or the IEEE 802.11be standard. In addition, the example of the present specification may be applied to a mobile communication system. For example, it may be applied to a mobile communication system based on long term evolution (LTE) depending on a 3rd generation partnership project (3GPP) standard and based on evolution of the LTE. In addition, the example of the present specification may be applied to a communication system of a 5G NR standard based on the 3GPP standard.

Hereinafter, in order to describe a technical feature of the present specification, a technical feature applicable to the present specification will be described.

FIG. 1 shows an example of a transmitting apparatus and/or receiving apparatus of the present specification.

In the example of FIG. 1, various technical features described below may be performed. FIG. 1 relates to at least one station (STA). For example, STAs 110 and 120 of the present specification may also be called in various terms such as a mobile terminal, a wireless device, a wireless transmit/receive unit (WTRU), a user equipment (UE), a mobile station (MS), a mobile subscriber unit, or simply a user. The STAs 110 and 120 of the present specification may also be called in various terms such as a network, a base station, a node-B, an access point (AP), a repeater, a router, a relay, or the like. The STAs 110 and 120 of the present specification may also be referred to as various names such as a receiving apparatus, a transmitting apparatus, a receiving STA, a transmitting STA, a receiving device, a transmitting device, or the like.

For example, the STAs 110 and 120 may serve as an AP or a non-AP. That is, the STAs 110 and 120 of the present specification may serve as the AP and/or the non-AP. In the present specification, the AP may be indicated as an AP STA.

The STAs 110 and 120 of the present specification may support various communication standards together in addition to the IEEE 802.11 standard. For example, a communication standard (e.g., LTE, LTE-A, 5G NR standard) or the like based on the 3GPP standard may be supported. In addition, the STA of the present specification may be implemented as various devices such as a mobile phone, a vehicle, a personal computer, or the like. In addition, the STA of the present specification may support communication for various communication services such as voice calls, video calls, data communication, and self-driving (autonomous-driving), or the like.

The STAs 110 and 120 of the present specification may include a medium access control (MAC) conforming to the IEEE 802.11 standard and a physical layer interface for a radio medium.

The STAs 110 and 120 will be described below with reference to a sub-figure (a) of FIG. 1.

The first STA 110 may include a processor 111, a memory 112, and a transceiver 113. The illustrated process, memory, and transceiver may be implemented individually as separate chips, or at least two blocks/functions may be implemented through a single chip.

The transceiver 113 of the first STA performs a signal transmission/reception operation. Specifically, an IEEE 802.11 packet (e.g., IEEE 802.11a/b/g/n/ac/ax/be, etc.) may be transmitted/received.

For example, the first STA 110 may perform an operation intended by an AP. For example, the processor 111 of the AP may receive a signal through the transceiver 113, process a reception (RX) signal, generate a transmission (TX) signal, and provide control for signal transmission. The memory 112 of the AP may store a signal (e.g., RX signal) received through the transceiver 113, and may store a signal (e.g., TX signal) to be transmitted through the transceiver.

For example, the second STA 120 may perform an operation intended by a non-AP STA. For example, a transceiver 123 of a non-AP performs a signal transmission/reception operation. Specifically, an IEEE 802.11 packet (e.g., IEEE 802.11a/b/g/n/ac/ax/be packet, etc.) may be transmitted/received.

For example, a processor 121 of the non-AP STA may receive a signal through the transceiver 123, process an RX signal, generate a TX signal, and provide control for signal transmission. A memory 122 of the non-AP STA may store a signal (e.g., RX signal) received through the transceiver 123, and may store a signal (e.g., TX signal) to be transmitted through the transceiver.

For example, an operation of a device indicated as an AP in the specification described below may be performed in the first STA 110 or the second STA 120. For example, if the first STA 110 is the AP, the operation of the device indicated as the AP may be controlled by the processor 111 of the first STA 110, and a related signal may be transmitted or received through the transceiver 113 controlled by the processor 111 of the first STA 110. In addition, control information related to the operation of the AP or a TX/RX signal of the AP may be stored in the memory 112 of the first STA 110. In addition, if the second STA 120 is the AP, the operation of the device indicated as the AP may be controlled by the processor 121 of the second STA 120, and a related signal may be transmitted or received through the transceiver 123 controlled by the processor 121 of the second STA 120. In addition, control information related to the operation of the AP or a TX/RX signal of the AP may be stored in the memory 122 of the second STA 120.

For example, in the specification described below, an operation of a device indicated as a non-AP (or user-STA) may be performed in the first STA 110 or the second STA 120. For example, if the second STA 120 is the non-AP, the operation of the device indicated as the non-AP may be controlled by the processor 121 of the second STA 120, and a related signal may be transmitted or received through the transceiver 123 controlled by the processor 121 of the second STA 120. In addition, control information related to the operation of the non-AP or a TX/RX signal of the non-AP may be stored in the memory 122 of the second STA 120. For example, if the first STA 110 is the non-AP, the operation of the device indicated as the non-AP may be controlled by the processor 111 of the first STA 110, and a related signal may be transmitted or received through the transceiver 113 controlled by the processor 111 of the first STA 110. In addition, control information related to the operation of the non-AP or a TX/RX signal of the non-AP may be stored in the memory 112 of the first STA 110.

In the specification described below, a device called a (transmitting/receiving) STA, a first STA, a second STA, a STA1, a STA2, an AP, a first AP, a second AP, an AP1, an AP2, a (transmitting/receiving) terminal, a (transmitting/receiving) device, a (transmitting/receiving) apparatus, a network, or the like may imply the STAs 110 and 120 of FIG. 1. For example, a device indicated as, without a specific reference numeral, the (transmitting/receiving) STA, the first STA, the second STA, the STA1, the STA2, the AP, the first AP, the second AP, the AP1, the AP2, the (transmitting/receiving) terminal, the (transmitting/receiving) device, the (transmitting/receiving) apparatus, the network, or the like may imply the STAs 110 and 120 of FIG. 1. For example, in the following example, an operation in which various STAs transmit/receive a signal (e.g., a PPDU) may be performed in the transceivers 113 and 123 of FIG. 1. In addition, in the following example, an operation in which various STAs generate a TX/RX signal or perform data processing and computation in advance for the TX/RX signal may be performed in the processors 111 and 121 of FIG. 1. For example, an example of an operation for generating the TX/RX signal or performing the data processing and computation in advance may include: 1) an operation of determining/obtaining/configuring/computing/decoding/encoding bit information of a sub-field (SIG, STF, LTF, Data) included in a PPDU; 2) an operation of determining/configuring/obtaining a time resource or frequency resource (e.g., a subcarrier resource) or the like used for the sub-field (SIG, STF, LTF, Data) included the PPDU; 3) an operation of determining/configuring/obtaining a specific sequence (e.g., a pilot sequence, an STF/LTF sequence, an extra sequence applied to SIG) or the like used for the sub-field (SIG, STF, LTF, Data) field included in the PPDU; 4) a power control operation and/or power saving operation applied for the STA; and 5) an operation related to determining/obtaining/configuring/decoding/encoding or the like of an ACK signal. In addition, in the following example, a variety of information used by various STAs for determining/obtaining/configuring/computing/decoding/decoding a TX/RX signal (e.g., information related to a field/subfield/control field/parameter/power or the like) may be stored in the memories 112 and 122 of FIG. 1.

The aforementioned device/STA of the sub-figure (a) of FIG. 1 may be modified as shown in the sub-figure (b) of FIG. 1. Hereinafter, the STAs 110 and 120 of the present specification will be described based on the sub-figure (b) of FIG. 1.

For example, the transceivers 113 and 123 illustrated in the sub-figure (b) of FIG. 1 may perform the same function as the aforementioned transceiver illustrated in the sub-figure (a) of FIG. 1. For example, processing chips 114 and 124 illustrated in the sub-figure (b) of FIG. 1 may include the processors 111 and 121 and the memories 112 and 122. The processors 111 and 121 and memories 112 and 122 illustrated in the sub-figure (b) of FIG. 1 may perform the same function as the aforementioned processors 111 and 121 and memories 112 and 122 illustrated in the sub-figure (a) of FIG. 1.

A mobile terminal, a wireless device, a wireless transmit/receive unit (WTRU), a user equipment (UE), a mobile station (MS), a mobile subscriber unit, a user, a user STA, a network, a base station, a Node-B, an access point (AP), a repeater, a router, a relay, a receiving unit, a transmitting unit, a receiving STA, a transmitting STA, a receiving device, a transmitting device, a receiving apparatus, and/or a transmitting apparatus, which are described below, may imply the STAs 110 and 120 illustrated in the sub-figure (a)/(b) of FIG. 1, or may imply the processing chips 114 and 124 illustrated in the sub-figure (b) of FIG. 1. That is, a technical feature of the present specification may be performed in the STAs 110 and 120 illustrated in the sub-figure (a)/(b) of FIG. 1, or may be performed only in the processing chips 114 and 124 illustrated in the sub-figure (b) of FIG. 1. For example, a technical feature in which the transmitting STA transmits a control signal may be understood as a technical feature in which a control signal generated in the processors 111 and 121 illustrated in the sub-figure (a)/(b) of FIG. 1 is transmitted through the transceivers 113 and 123 illustrated in the sub-figure (a)/(b) of FIG. 1. Alternatively, the technical feature in which the transmitting STA transmits the control signal may be understood as a technical feature in which the control signal to be transferred to the transceivers 113 and 123 is generated in the processing chips 114 and 124 illustrated in the sub-figure (b) of FIG. 1.

For example, a technical feature in which the receiving STA receives the control signal may be understood as a technical feature in which the control signal is received by means of the transceivers 113 and 123 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (a) of FIG. 1 is obtained by the processors 111 and 121 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (b) of FIG. 1 is obtained by the processing chips 114 and 124 illustrated in the sub-figure (b) of FIG. 1.

Referring to the sub-figure (b) of FIG. 1, software codes 115 and 125 may be included in the memories 112 and 122. The software codes 115 and 126 may include instructions for controlling an operation of the processors 111 and 121. The software codes 115 and 125 may be included as various programming languages.

The processors 111 and 121 or processing chips 114 and 124 of FIG. 1 may include an application-specific integrated circuit (ASIC), other chipsets, a logic circuit and/or a data processing device. The processor may be an application processor (AP). For example, the processors 111 and 121 or processing chips 114 and 124 of FIG. 1 may include at least one of a digital signal processor (DSP), a central processing unit (CPU), a graphics processing unit (GPU), and a modulator and demodulator (modem). For example, the processors 111 and 121 or processing chips 114 and 124 of FIG. 1 may be SNAPDRAGON™ series of processors made by Qualcomm®, EXYNOS™ series of processors made by Samsung®, A series of processors made by Apple®, HELIO™ series of processors made by MediaTek®, ATOM™ series of processors made by Intel® or processors enhanced from these processors.

In the present specification, an uplink may imply a link for communication from a non-AP STA to an SP STA, and an uplink PPDU/packet/signal or the like may be transmitted through the uplink. In addition, in the present specification, a downlink may imply a link for communication from the AP STA to the non-AP STA, and a downlink PPDU/packet/signal or the like may be transmitted through the downlink.

FIG. 2 is a conceptual view illustrating the structure of a wireless local area network (WLAN).

An upper part of FIG. 2 illustrates the structure of an infrastructure basic service set (BSS) of institute of electrical and electronic engineers (IEEE) 802.11.

Referring the upper part of FIG. 2, the wireless LAN system may include one or more infrastructure BSSs 200 and 205 (hereinafter, referred to as BSS). The BSSs 200 and 205 as a set of an AP and a STA such as an access point (AP) 225 and a station (STA1) 200-1 which are successfully synchronized to communicate with each other are not concepts indicating a specific region. The BSS 205 may include one or more STAs 205-1 and 205-2 which may be joined to one AP 230.

The BSS may include at least one STA, APs providing a distribution service, and a distribution system (DS) 210 connecting multiple APs.

The distribution system 210 may implement an extended service set (ESS) 240 extended by connecting the multiple BSSs 200 and 205. The ESS 240 may be used as a term indicating one network configured by connecting one or more APs 225 or 230 through the distribution system 210. The AP included in one ESS 240 may have the same service set identification (SSID).

A portal 220 may serve as a bridge which connects the wireless LAN network (IEEE 802.11) and another network (e.g., 802.X).

In the BSS illustrated in the upper part of FIG. 2, a network between the APs 225 and 230 and a network between the APs 225 and 230 and the STAs 200-1, 205-1, and 205-2 may be implemented. However, the network is configured even between the STAs without the APs 225 and 230 to perform communication. A network in which the communication is performed by configuring the network even between the STAs without the APs 225 and 230 is defined as an Ad-Hoc network or an independent basic service set (IBSS).

A lower part of FIG. 2 illustrates a conceptual view illustrating the IBSS.

Referring to the lower part of FIG. 2, the IBSS is a BSS that operates in an Ad-Hoc mode. Since the IBSS does not include the access point (AP), a centralized management entity that performs a management function at the center does not exist. That is, in the IBSS, STAs 250-1, 250-2, 250-3, 255-4, and 255-5 are managed by a distributed manner. In the IBSS, all STAs 250-1, 250-2, 250-3, 255-4, and 255-5 may be constituted by movable STAs and are not permitted to access the DS to constitute a self-contained network.

FIG. 3 illustrates a general link setup process.

In S310, a STA may perform a network discovery operation. The network discovery operation may include a scanning operation of the STA. That is, to access a network, the STA needs to discover a participating network. The STA needs to identify a compatible network before participating in a wireless network, and a process of identifying a network present in a particular area is referred to as scanning. Scanning methods include active scanning and passive scanning.

FIG. 3 illustrates a network discovery operation including an active scanning process. In active scanning, a STA performing scanning transmits a probe request frame and waits for a response to the probe request frame in order to identify which AP is present around while moving to channels. A responder transmits a probe response frame as a response to the probe request frame to the STA having transmitted the probe request frame. Here, the responder may be a STA that transmits the last beacon frame in a BSS of a channel being scanned. In the BSS, since an AP transmits a beacon frame, the AP is the responder. In an IBSS, since STAs in the IBSS transmit a beacon frame in turns, the responder is not fixed. For example, when the STA transmits a probe request frame via channel 1 and receives a probe response frame via channel 1, the STA may store BSS-related information included in the received probe response frame, may move to the next channel (e.g., channel 2), and may perform scanning (e.g., transmits a probe request and receives a probe response via channel 2) by the same method.

Although not shown in FIG. 3, scanning may be performed by a passive scanning method. In passive scanning, a STA performing scanning may wait for a beacon frame while moving to channels. A beacon frame is one of management frames in IEEE 802.11 and is periodically transmitted to indicate the presence of a wireless network and to enable the STA performing scanning to find the wireless network and to participate in the wireless network. In a BSS, an AP serves to periodically transmit a beacon frame. In an IBSS, STAs in the IBSS transmit a beacon frame in turns. Upon receiving the beacon frame, the STA performing scanning stores information about a BSS included in the beacon frame and records beacon frame information in each channel while moving to another channel. The STA having received the beacon frame may store BSS-related information included in the received beacon frame, may move to the next channel, and may perform scanning in the next channel by the same method.

After discovering the network, the STA may perform an authentication process in S320. The authentication process may be referred to as a first authentication process to be clearly distinguished from the following security setup operation in S340. The authentication process in S320 may include a process in which the STA transmits an authentication request frame to the AP and the AP transmits an authentication response frame to the STA in response. The authentication frames used for an authentication request/response are management frames.

The authentication frames may include information about an authentication algorithm number, an authentication transaction sequence number, a status code, a challenge text, a robust security network (RSN), and a finite cyclic group.

The STA may transmit the authentication request frame to the AP. The AP may determine whether to allow the authentication of the STA based on the information included in the received authentication request frame. The AP may provide the authentication processing result to the STA via the authentication response frame.

When the STA is successfully authenticated, the STA may perform an association process in S330. The association process includes a process in which the STA transmits an association request frame to the AP and the AP transmits an association response frame to the STA in response. The association request frame may include, for example, information about various capabilities, a beacon listen interval, a service set identifier (SSID), a supported rate, a supported channel, RSN, a mobility domain, a supported operating class, a traffic indication map (TIM) broadcast request, and an interworking service capability. The association response frame may include, for example, information about various capabilities, a status code, an association ID (AID), a supported rate, an enhanced distributed channel access (EDCA) parameter set, a received channel power indicator (RCPI), a received signal-to-noise indicator (RSNI), a mobility domain, a timeout interval (association comeback time), an overlapping BSS scanning parameter, a TIM broadcast response, and a QoS map.

In S340, the STA may perform a security setup process. The security setup process in S340 may include a process of setting up a private key through four-way handshaking, for example, through an extensible authentication protocol over LAN (EAPOL) frame.

FIG. 4 illustrates an example of a PPDU used in an IEEE standard.

As illustrated, various types of PHY protocol data units (PPDUs) are used in IEEE a/g/n/ac standards. Specifically, an LTF and a STF include a training signal, a SIG-A and a SIG-B include control information for a receiving STA, and a data field includes user data corresponding to a PSDU (MAC PDU/aggregated MAC PDU).

FIG. 4 also includes an example of an HE PPDU according to IEEE 802.11ax. The HE PPDU according to FIG. 4 is an illustrative PPDU for multiple users. An HE-SIG-B may be included only in a PPDU for multiple users, and an HE-SIG-B may be omitted in a PPDU for a single user.

As illustrated in FIG. 4, the HE-PPDU for multiple users (MUs) may include a legacy-short training field (L-STF), a legacy-long training field (L-LTF), a legacy-signal (L-SIG), a high efficiency-signal A (HE-SIG A), a high efficiency-signal-B (HE-SIG B), a high efficiency-short training field (HE-STF), a high efficiency-long training field (HE-LTF), a data field (alternatively, an MAC payload), and a packet extension (PE) field. The respective fields may be transmitted for illustrated time periods (i.e., 4 or 8 µs).

Hereinafter, a resource unit (RU) used for a PPDU is described. An RU may include a plurality of subcarriers (or tones). An RU may be used to transmit a signal to a plurality of STAs according to OFDMA. Further, an RU may also be defined to transmit a signal to one STA. An RU may be used for an STF, an LTF, a data field, or the like.

Figure 5:
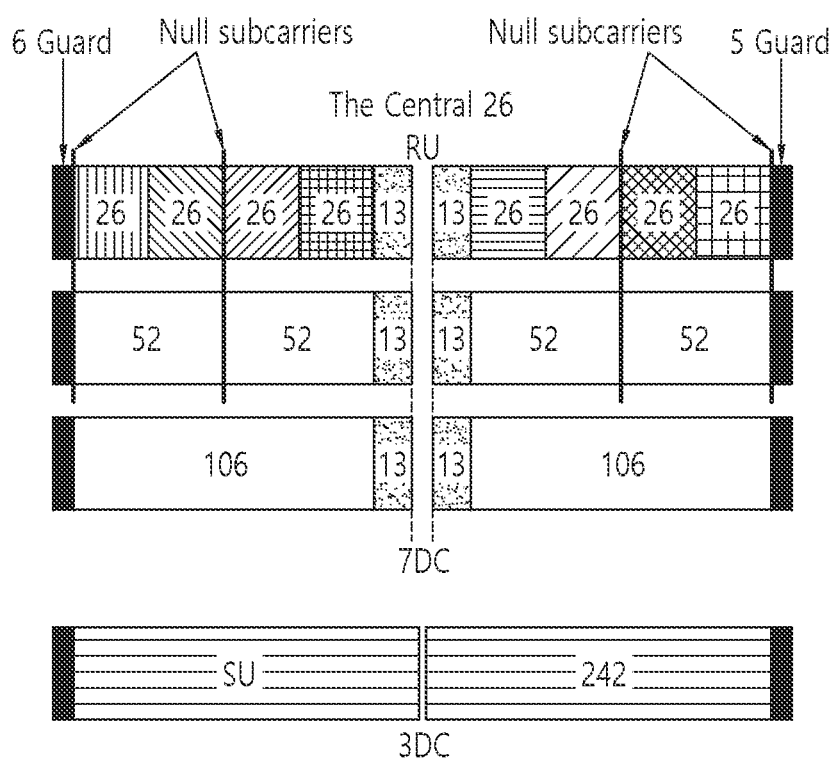
FIG. 5 illustrates a layout of resource units (RUs) used in a band of 20 MHz.

FIG. 5 illustrates a layout of resource units (RUs) used in a band of 20 MHz.

As illustrated in FIG. 5, resource units (RUs) corresponding to different numbers of tones (i.e., subcarriers) may be used to form some fields of an HE-PPDU. For example, resources may be allocated in illustrated RUs for an HE-STF, an HE-LTF, and a data field.

As illustrated in the uppermost part of FIG. 5, a 26-unit (i.e., a unit corresponding to 26 tones) may be disposed. Six tones may be used for a guard band in the leftmost band of the 20 MHz band, and five tones may be used for a guard band in the rightmost band of the 20 MHz band. Further, seven DC tones may be inserted in a center band, that is, a DC band, and a 26-unit corresponding to 13 tones on each of the left and right sides of the DC band may be disposed. A 26-unit, a 52-unit, and a 106-unit may be allocated to other bands. Each unit may be allocated for a receiving STA, that is, a user.

The layout of the RUs in FIG. 5 may be used not only for a multiple users (MUs) but also for a single user (SU), in which case one 242-unit may be used and three DC tones may be inserted as illustrated in the lowermost part of FIG. 5.

Although FIG. 5 proposes RUs having various sizes, that is, a 26-RU, a 52-RU, a 106-RU, and a 242-RU, specific sizes of RUs may be extended or increased. Therefore, the present embodiment is not limited to the specific size of each RU (i.e., the number of corresponding tones).

Figure 6:
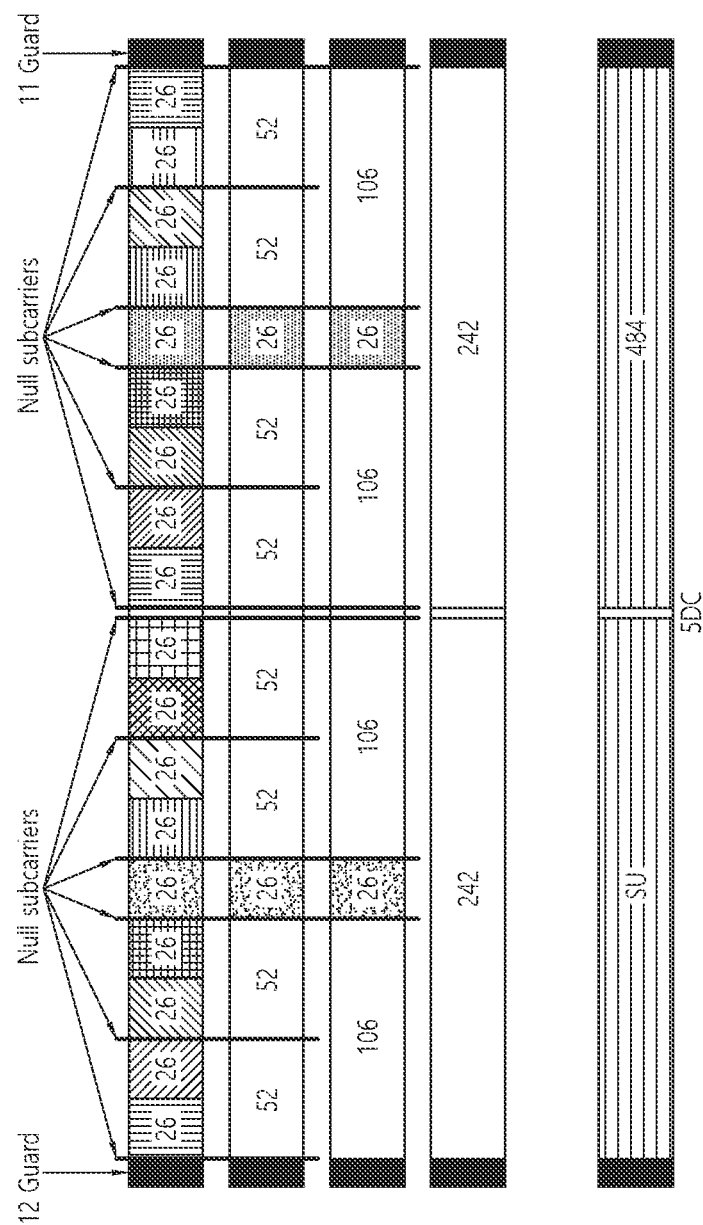
FIG. 6 illustrates a layout of RUs used in a band of 40 MHz.

FIG. 6 illustrates a layout of RUs used in a band of 40 MHz.

Similar to FIG. 5 in which RUs having various sizes are used, a 26-RU, a 52-RU, a 106-RU, a 242-RU, a 484-RU, and the like may be used in an example of FIG. 6. Further, five DC tones may be inserted in a center frequency, 12 tones may be used for a guard band in the leftmost band of the 40 MHz band, and 11 tones may be used for a guard band in the rightmost band of the 40 MHz band.

As illustrated in FIG. 6, when the layout of the RUs is used for a single user, a 484-RU may be used. The specific number of RUs may be changed similar to FIG. 5.

Figure 7:
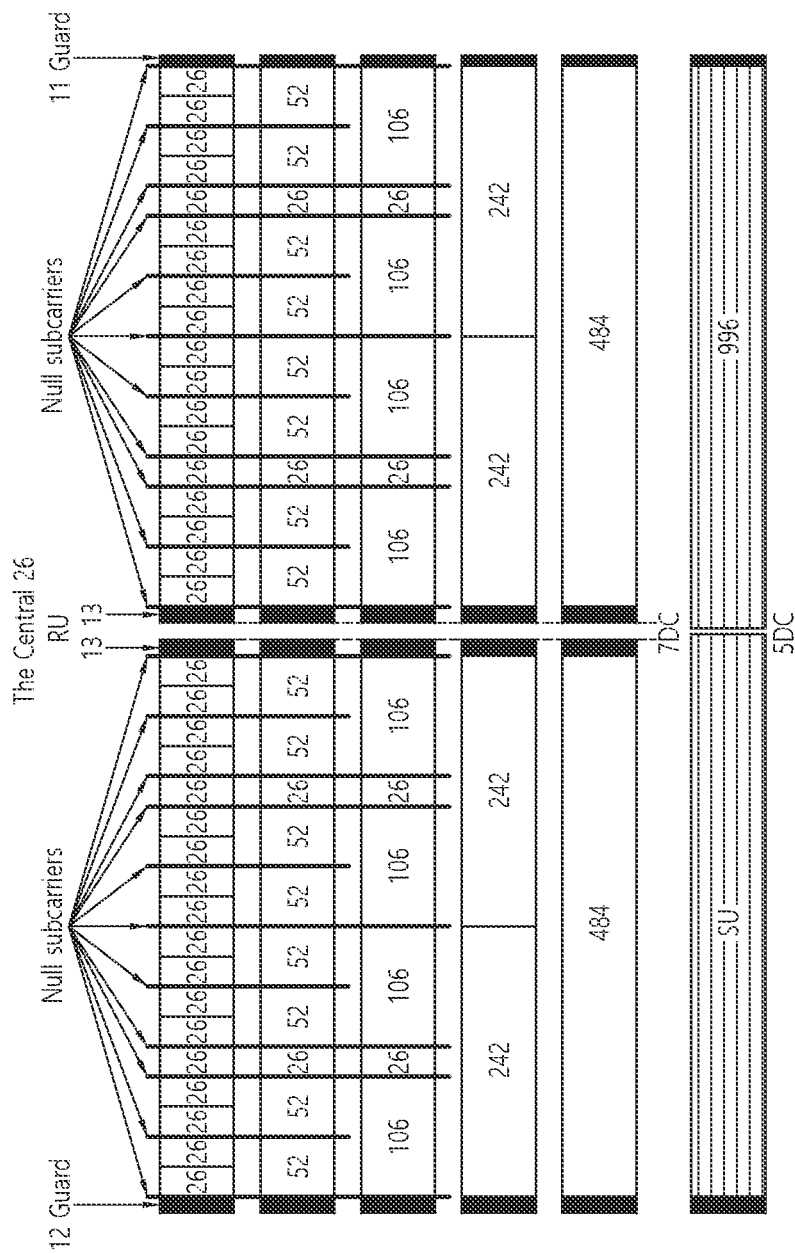
FIG. 7 illustrates a layout of RUs used in a band of 80 MHz.

FIG. 7 illustrates a layout of RUs used in a band of 80 MHz.

Similar to FIG. 5 and FIG. 6 in which RUs having various sizes are used, a 26-RU, a 52-RU, a 106-RU, a 242-RU, a 484-RU, a 996-RU, and the like may be used in an example of FIG. 7. Further, seven DC tones may be inserted in the center frequency, 12 tones may be used for a guard band in the leftmost band of the 80 MHz band, and 11 tones may be used for a guard band in the rightmost band of the 80 MHz band. In addition, a 26-RU corresponding to 13 tones on each of the left and right sides of the DC band may be used.

As illustrated in FIG. 7, when the layout of the RUs is used for a single user, a 996-RU may be used, in which case five DC tones may be inserted.

In the meantime, the fact that the specific number of RUs can be changed is the same as those of FIGS. 5 and 6.

The RU arrangement (i.e., RU location) shown in FIGS. 5 to 7 can be applied to a new wireless LAN system (e.g. EHT system) as it is. Meanwhile, for the 160 MHz band supported by the new WLAN system, the RU arrangement for 80 MHz (i.e., an example of FIG. 7) may be repeated twice, or the RU arrangement for the 40 MHz (i.e., an example of FIG. 6) may be repeated 4 times. In addition, when the EHT PPDU is configured for the 320 MHz band, the arrangement of the RU for 80 MHz (i.e., an example of FIG. 7) may be repeated 4 times or the arrangement of the RU for 40 MHz (i.e., an example of FIG. 6) may be repeated 8 times.

One RU of the present specification may be allocated for a single STA (e.g., a single non-AP STA). Alternatively, a plurality of RUs may be allocated for one STA (e.g., a non-AP STA).

The RU described in the present specification may be used in uplink (UL) communication and downlink (DL) communication. For example, when UL-MU communication which is solicited by a trigger frame is performed, a transmitting STA (e.g., an AP) may allocate a first RU (e.g., 26/52/106/242-RU, etc.) to a first STA through the trigger frame, and may allocate a second RU (e.g., 26/52/106/242-RU, etc.) to a second STA. Thereafter, the first STA may transmit a first trigger-based PPDU based on the first RU, and the second STA may transmit a second trigger-based PPDU based on the second RU. The first/second trigger-based PPDU is transmitted to the AP at the same (or overlapped) time period.

For example, when a DL MU PPDU is configured, the transmitting STA (e.g., AP) may allocate the first RU (e.g., 26/52/106/242-RU. etc.) to the first STA, and may allocate the second RU (e.g., 26/52/106/242-RU, etc.) to the second STA. That is, the transmitting STA (e.g., AP) may transmit HE-STF, HE-LTF, and Data fields for the first STA through the first RU in one MU PPDU, and may transmit HE-STF, HE-LTF, and Data fields for the second STA through the second RU.

Information related to a layout of the RU may be signaled through HE-SIG-B.

Figure 8:
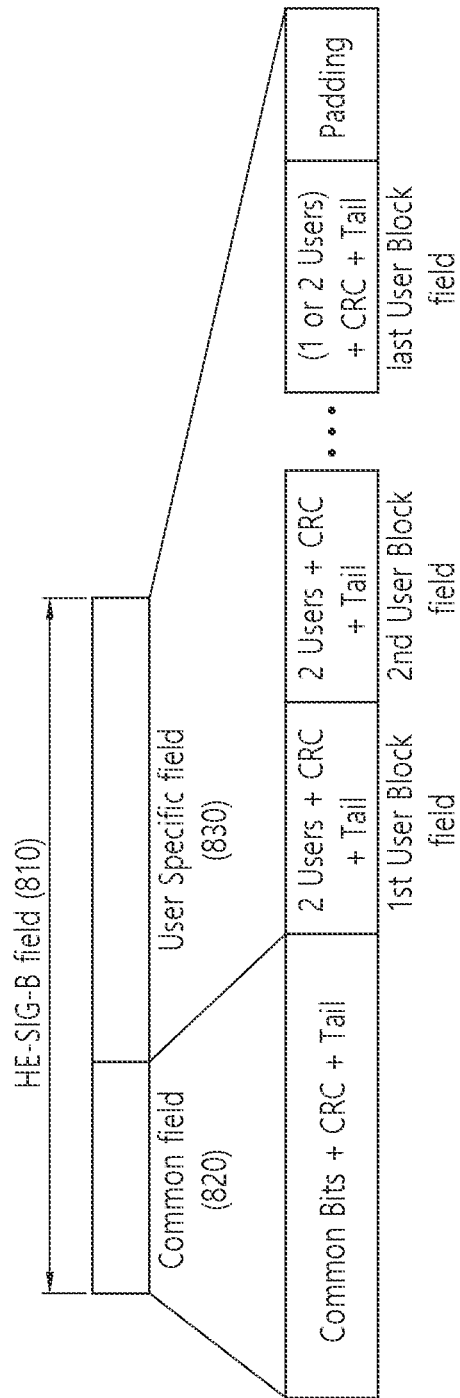
FIG. 8 illustrates a structure of an HE-SIG-B field.

FIG. 8 illustrates a structure of an HE-SIG-B field.

As illustrated, an HE-SIG-B field 810 includes a common field 820 and a user-specific field 830. The common field 820 may include information commonly applied to all users (i.e., user STAs) which receive SIG-B. The user-specific field 830 may be called a user-specific control field. When the SIG-B is transferred to a plurality of users, the user-specific field 830 may be applied only any one of the plurality of users.

As illustrated in FIG. 8, the common field 820 and the user-specific field 830 may be separately encoded.

The common field 820 may include RU allocation information of N*8 bits. For example, the RU allocation information may include information related to a location of an RU. For example, when a 20 MHz channel is used as shown in FIG. 5, the RU allocation information may include information related to a specific frequency band to which a specific RU (26-RU/52-RU/106-RU) is arranged.

An example of a case in which the RU allocation information consists of 8 bits is as follows.

TABLE 1

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 00000000 | 26 | 26 | 26 | 26 | 26 | 26 | 26 | 26 | 26 | 1 |
| 00000001 | 26 | 26 | 26 | 26 | 26 | 26 | 26 | 52 |  | 1 |
| 00000010 | 26 | 26 | 26 | 26 | 26 | 52 | 26 | 26 |  | 1 |
| 00000011 | 26 | 26 | 26 | 26 | 26 | 52 | 52 |  |  | 1 |
| 00000100 | 26 | 26 | 52 | 26 | 26 | 26 | 26 |  |  | 1 |
| 00000101 | 26 | 26 | 52 | 26 | 26 | 52 |  |  |  | 1 |
| 00000110 | 26 | 26 | 52 | 26 | 52 | 26 | 26 |  |  | 1 |
| 00000111 | 26 | 26 | 52 | 26 | 52 | 52 |  |  |  | 1 |
| 00001000 | 52 | 26 | 26 | 26 | 26 | 26 | 26 |  |  | 1 |

As shown the example of FIG. 5, up to nine 26-RUs may be allocated to the 20 MHz channel. When the RU allocation information of the common field 820 is set to "00000000" as shown in Table 1, the nine 26-RUs may be allocated to a corresponding channel (i.e., 20 MHz). In addition, when the RU allocation information of the common field 820 is set to "00000001" as shown in Table 1, seven 26-RUs and one 52-RU are arranged in a corresponding channel. That is, in the example of FIG. 5, the 52-RU may be allocated to the rightmost side, and the seven 26-RUs may be allocated to the left thereof.

The example of Table 1 shows only some of RU locations capable of displaying the RU allocation information.

For example, the RU allocation information may include an example of Table 2 below.

TABLE 2

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 01000$y_2y_1y_0$ |  | 106 |  |  | 26 | 26 | 26 | 26 | 26 | 8 |
| 01001$y_2y_1y_0$ |  | 106 |  |  | 26 | 26 | 26 | 52 |  | 8 |

"01000y2y1y0" relates to an example in which a 106-RU is allocated to the leftmost side of the 20 MHz channel, and five 26-RUs are allocated to the right side thereof. In this case, a plurality of STAs (e.g., user-STAs) may be allocated to the 106-RU, based on a MU-MIMO scheme. Specifically, up to 8 STAs (e.g., user-STAs) may be allocated to the 106-RU, and the number of STAs (e.g., user-STAs) allocated to the 106-RU is determined based on 3-bit information (y2y1y0). For example, when the 3-bit information (y2y1y0) is set to N, the number of STAs (e.g., user-STAs) allocated to the 106-RU based on the MU-MIMO scheme may be N+1.

In general, a plurality of STAs (e.g., user STAs) different from each other may be allocated to a plurality of RUs. However, the plurality of STAs (e.g., user STAs) may be allocated to one or more RUs having at least a specific size (e.g., 106 subcarriers), based on the MU-MIMO scheme.

As shown in FIG. 8, the user-specific field 830 may include a plurality of user fields. As described above, the number of STAs (e.g., user STAs) allocated to a specific channel may be determined based on the RU allocation information of the common field 820. For example, when the RU allocation information of the common field 820 is "00000000", one user STA may be allocated to each of nine 26-RUs (e.g., nine user STAs may be allocated). That is, up to 9 user STAs may be allocated to a specific channel through an OFDMA scheme. In other words, up to 9 user STAs may be allocated to a specific channel through a non-MU-MIMO scheme.

For example, when RU allocation is set to "01000y2y1y0", a plurality of STAs may be allocated to the 106-RU arranged at the leftmost side through the MU-MIMO scheme, and five user STAs may be allocated to five 26-RUs arranged to the right side thereof through the non-MU MIMO scheme. This case is specified through an example of FIG. 9.

Figure 9:
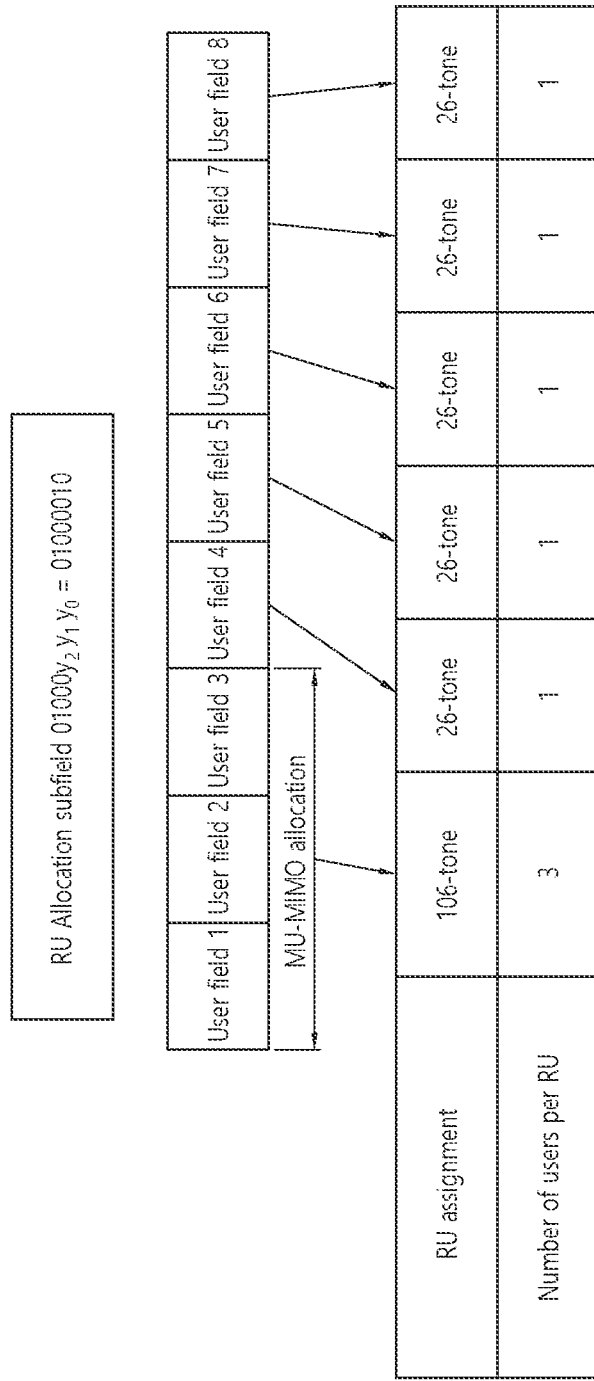
FIG. 9 illustrates an example in which a plurality of user STAs are allocated to the same RU through a MU-MIMO scheme.

FIG. 9 illustrates an example in which a plurality of user STAs are allocated to the same RU through a MU-MIMO scheme.

For example, when RU allocation is set to "01000010" as shown in FIG. 9, a 106-RU may be allocated to the leftmost side of a specific channel, and five 26-RUs may be allocated to the right side thereof. In addition, three user STAs may be allocated to the 106-RU through the MU-MIMO scheme. As a result, since eight user STAs are allocated, the user-specific field 830 of HE-SIG-B may include eight user fields.

The eight user fields may be expressed in the order shown in FIG. 9. In addition, as shown in FIG. 8, two user fields may be implemented with one user block field.

The user fields shown in FIG. 8 and FIG. 9 may be configured based on two formats. That is, a user field related to a MU-MIMO scheme may be configured in a first format, and a user field related to a non-MIMO scheme may be configured in a second format. Referring to the example of FIG. 9, a user field 1 to a user field 3 may be based on the first format, and a user field 4 to a user field 8 may be based on the second format. The first format or the second format may include bit information of the same length (e.g., 21 bits).

Each user field may have the same size (e.g., 21 bits). For example, the user field of the first format (the first of the MU-MIMO scheme) may be configured as follows.

For example, a first bit (i.e., B0-B10) in the user field (i.e., 21 bits) may include identification information (e.g., STA-ID, partial AID, etc.) of a user STA to which a corresponding user field is allocated. In addition, a second bit (i.e., B11-B14) in the user field (i.e., 21 bits) may include information related to a spatial configuration. Specifically, an example of the second bit (i.e., B11-B14) may be as shown in Table 3 and Table 4 below.

TABLE 3

| $N_{user}$ | B3...B0 | $N_{STS}$[1] | $N_{STS}$[2] | $N_{STS}$[3] | $N_{STS}$[4] | $N_{STS}$[5] | $N_{STS}$[6] | $N_{STS}$[7] | $N_{STS}$[8] | Total $N_{STS}$ | Number of entries |
|---|---|---|---|---|---|---|---|---|---|---|---|
| 2 | 0000-0011 | 1-4 | 1 | | | | | | | 2-5 | 10 |
|   | 0100-0110 | 2-4 | 2 | | | | | | | 4-6 | |
|   | 0111-1000 | 3-4 | 3 | | | | | | | 6-7 | |
|   | 1001 | 4 | 4 | | | | | | | 8 | |
| 3 | 0000-0011 | 1-4 | 1 | 1 | | | | | | 3-6 | 13 |
|   | 0100-0110 | 2-4 | 2 | 1 | | | | | | 5-7 | |
|   | 0111-1000 | 3-4 | 3 | 1 | | | | | | 7-8 | |
|   | 1001-1011 | 2-4 | 2 | 2 | | | | | | 6-8 | |
|   | 1100 | 3 | 3 | 2 | | | | | | 8 | |
| 4 | 0000-0011 | 1-4 | 1 | 1 | 1 | | | | | 4-7 | 11 |
|   | 0100-0110 | 2-4 | 2 | 1 | 1 | | | | | 6-8 | |
|   | 0111 | 3 | 3 | 1 | 1 | | | | | 8 | |
|   | 1000-1001 | 2-3 | 2 | 2 | 1 | | | | | 7-8 | |
|   | 1010 | 2 | 2 | 2 | 2 | | | | | 8 | |

TABLE 4

| $N_{user}$ | B3...B0 | $N_{STS}$[1] | $N_{STS}$[2] | $N_{STS}$[3] | $N_{STS}$[4] | $N_{STS}$[5] | $N_{STS}$[6] | $N_{STS}$[7] | $N_{STS}$[8] | Total $N_{STS}$ | Number of entries |
|---|---|---|---|---|---|---|---|---|---|---|---|
| 5 | 0000-0011 | 1-4 | 1 | 1 | 1 | 1 | | | | 5-8 | 7 |
|   | 0100-0101 | 2-3 | 2 | 1 | 1 | 1 | | | | 7-8 | |
|   | 0110 | 2 | 2 | 2 | 1 | 1 | | | | 8 | |
| 6 | 0000-0010 | 1-3 | 1 | 1 | 1 | 1 | 1 | | | 6-8 | 4 |
|   | 0011 | 2 | 2 | 1 | 1 | 1 | 1 | | | 8 | |
| 7 | 0000-0001 | 1-2 | 1 | 1 | 1 | 1 | 1 | 1 | | 7-8 | 2 |
| 8 | 0000 | 1 | 1 | 1 | 1 | 1 | 1 | 1 | 1 | 8 | 1 |

As shown in Table 3 and/or Table 4, the second bit (e.g., B11-B14) may include information related to the number of spatial streams allocated to the plurality of user STAs which are allocated based on the MU-MIMO scheme. For example, when three user STAs are allocated to the 106-RU based on the MU-MIMO scheme as shown in FIG. 9, N user is set to "3". Therefore, values of N_STS[1], N_STS[2], and N_STS [3] may be determined as shown in Table 3. For example, when a values of the second bit (B11-B14) is "0011", it may be set to N_STS[1]=4, N_STS[2]=1, N_STS[3]=1. That is, in the example of FIG. 9, four spatial streams may be allocated to the user field 1, one spatial stream may be allocated to the user field 1, and one spatial stream may be allocated to the user field 3.

As shown in the example of Table 3 and/or Table 4, information (i.e., the second bit, B11-B14) related to the number of spatial streams for the user STA may consist of 4 bits. In addition, the information (i.e., the second bit, B11-B14) on the number of spatial streams for the user STA may support up to eight spatial streams. In addition, the information (i.e., the second bit, B11-B14) on the number of spatial streams for the user STA may support up to four spatial streams for one user STA.

In addition, a third bit (i.e., B15-18) in the user field (i.e., 21 bits) may include modulation and coding scheme (MCS) information. The MCS information may be applied to a data field in a PPDU including corresponding SIG-B.

An MCS, MCS information, an MCS index, an MCS field, or the like used in the present specification may be indicated by an index value. For example, the MCS information may be indicated by an index 0 to an index 11. The MCS information may include information related to a constellation modulation type (e.g., BPSK, QPSK, 16-QAM, 64-QAM, 256-QAM, 1024-QAM, etc.) and information related to a coding rate (e.g., 1/2, 2/3, 3/4, 5/6e, etc.). Information related to a channel coding type (e.g., LCC or LDPC) may be excluded in the MCS information.

In addition, a fourth bit (i.e., B19) in the user field (i.e., 21 bits) may be a reserved field.

In addition, a fifth bit (i.e., B20) in the user field (i.e., 21 bits) may include information related to a coding type (e.g., BCC or LDPC). That is, the fifth bit (i.e., B20) may include information related to a type (e.g., BCC or LDPC) of channel coding applied to the data field in the PPDU including the corresponding SIG-B.

The aforementioned example relates to the user field of the first format (the format of the MU-MIMO scheme). An example of the user field of the second format (the format of the non-MU-MIMO scheme) is as follows.

A first bit (e.g., B0-B10) in the user field of the second format may include identification information of a user STA. In addition, a second bit (e.g., B11-B13) in the user field of the second format may include information related to the number of spatial streams applied to a corresponding RU. In addition, a third bit (e.g., B14) in the user field of the second format may include information related to whether a beamforming steering matrix is applied. A fourth bit (e.g., B15-B18) in the user field of the second format may include modulation and coding scheme (MCS) information. In addition, a fifth bit (e.g., B19) in the user field of the second format may include information related to whether dual carrier modulation (DCM) is applied. In addition, a sixth bit (i.e., B20) in the user field of the second format may include information related to a coding type (e.g., BCC or LDPC).

Figure 10:
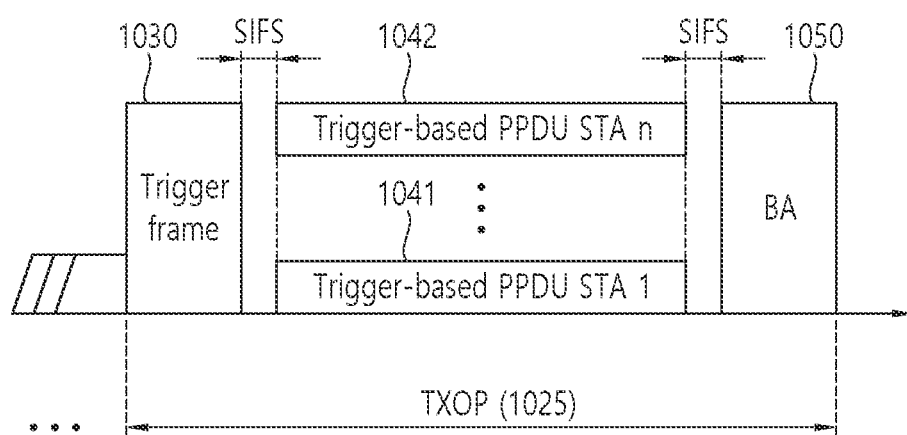
FIG. 10 illustrates an operation based on UL-MU.

FIG. 10 illustrates an operation based on UL-MU. As illustrated, a transmitting STA (e.g., an AP) may perform channel access through contending (e.g., a backoff operation), and may transmit a trigger frame 1030. That is, the transmitting STA may transmit a PPDU including the trigger frame 1030. Upon receiving the PPDU including the trigger frame, a trigger-based (TB) PPDU is transmitted after a delay corresponding to SIFS.

TB PPDUs 1041 and 1042 may be transmitted at the same time period, and may be transmitted from a plurality of STAs (e.g., user STAs) having AIDs indicated in the trigger frame 1030. An ACK frame 1050 for the TB PPDU may be implemented in various forms.

A specific feature of the trigger frame is described with reference to FIG. 11 to FIG. 13. Even if UL-MU communication is used, an orthogonal frequency division multiple access (OFDMA) scheme or a MU MIMO scheme may be used, and the OFDMA and MU-MIMO schemes may be simultaneously used.

Figure 11:
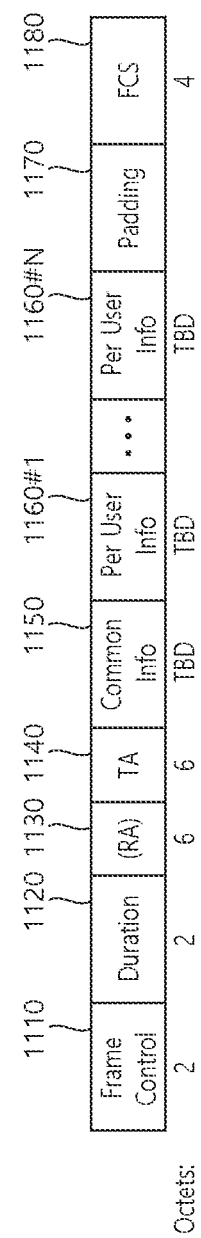
FIG. 11 illustrates an example of a trigger frame.

FIG. 11 illustrates an example of a trigger frame. The trigger frame of FIG. 11 allocates a resource for uplink multiple-user (MU) transmission, and may be transmitted, for example, from an AP. The trigger frame may be configured of a MAC frame, and may be included in a PPDU.

Each field shown in FIG. 11 may be partially omitted, and another field may be added. In addition, a length of each field may be changed to be different from that shown in the figure.

A frame control field 1110 of FIG. 11 may include information related to a MAC protocol version and extra additional control information. A duration field 1120 may include time information for NAV configuration or information related to an identifier (e.g., AID) of a STA.

In addition, an RA field 1130 may include address information of a receiving STA of a corresponding trigger frame, and may be optionally omitted. A TA field 1140 may include address information of a STA (e.g., an AP) which transmits the corresponding trigger frame. A common information field 1150 includes common control information applied to the receiving STA which receives the corresponding trigger frame. For example, a field indicating a length of an L-SIG field of an uplink PPDU transmitted in response to the corresponding trigger frame or information for controlling content of an SIG-A field (i.e., HE-SIG-A field) of the uplink PPDU transmitted in response to the corresponding trigger frame may be included. In addition, as common control information, information related to a length of a CP of the uplink PPDU transmitted in response to the corresponding trigger frame or information related to a length of an LTF field may be included.

In addition, per user information fields 1160#1 to 1160#N corresponding to the number of receiving STAs which receive the trigger frame of FIG. 11 are preferably included. The per user information field may also be called an "allocation field".

In addition, the trigger frame of FIG. 11 may include a padding field 1170 and a frame check sequence field 1180.

Each of the per user information fields 1160#1 to 1160#N shown in FIG. 11 may include a plurality of subfields.

Figure 12:
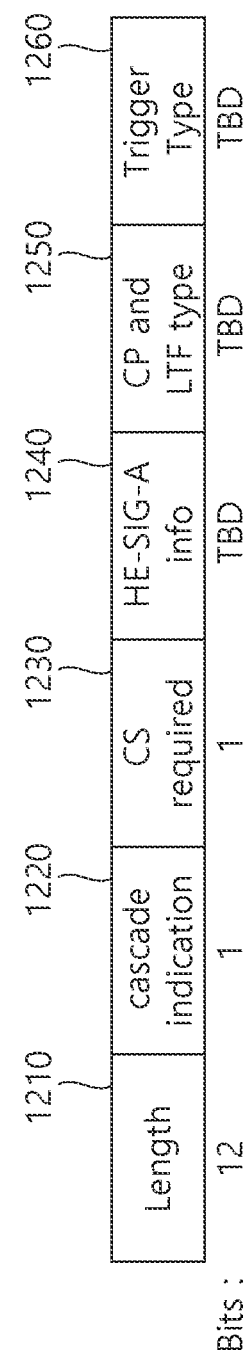
FIG. 12 illustrates an example of a common information field of a trigger frame.

FIG. 12 illustrates an example of a common information field of a trigger frame. A subfield of FIG. 12 may be partially omitted, and an extra subfield may be added. In addition, a length of each subfield illustrated may be changed.

A length field 1210 illustrated has the same value as a length field of an L-SIG field of an uplink PPDU transmitted in response to a corresponding trigger frame, and a length field of the L-SIG field of the uplink PPDU indicates a length of the uplink PPDU. As a result, the length field 1210 of the trigger frame may be used to indicate the length of the corresponding uplink PPDU.

In addition, a cascade identifier field 1220 indicates whether a cascade operation is performed. The cascade operation implies that downlink MU transmission and uplink MU transmission are performed together in the same TXOP. That is, it implies that downlink MU transmission is performed and thereafter uplink MU transmission is performed after a pre-set time (e.g., SIFS). During the cascade operation, only one transmitting device (e.g., AP) may perform downlink communication, and a plurality of transmitting devices (e.g., non-APs) may perform uplink communication.

A CS request field 1230 indicates whether a wireless medium state or an NAV or the like is necessarily considered in a situation where a receiving device which has received a corresponding trigger frame transmits a corresponding uplink PPDU.

An HE-SIG-A information field 1240 may include information for controlling content of an SIG-A field (i.e., HE-SIG-A field) of the uplink PPDU in response to the corresponding trigger frame.

A CP and LTF type field 1250 may include information related to a CP length and LTF length of the uplink PPDU transmitted in response to the corresponding trigger frame. A trigger type field 1260 may indicate a purpose of using the corresponding trigger frame, for example, typical triggering, triggering for beamforming, a request for block ACK/NACK, or the like.

It may be assumed that the trigger type field 1260 of the trigger frame in the present specification indicates a trigger frame of a basic type for typical triggering. For example, the trigger frame of the basic type may be referred to as a basic trigger frame.

Figure 13:
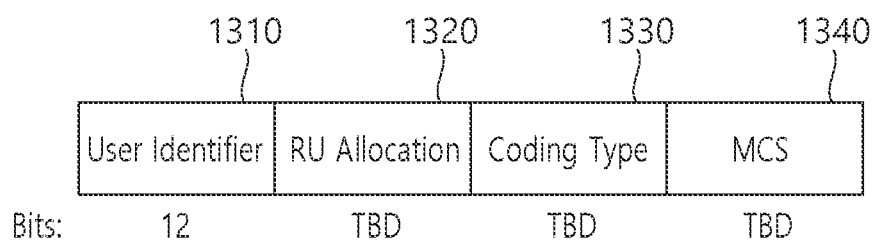
FIG. 13 illustrates an example of a subfield included in a per user information field.

FIG. 13 illustrates an example of a subfield included in a per user information field. A user information field 1300 of FIG. 13 may be understood as any one of the per user information fields 1160#1 to 1160#N mentioned above with reference to FIG. 11. A subfield included in the user information field 1300 of FIG. 13 may be partially omitted, and an extra subfield may be added. In addition, a length of each subfield illustrated may be changed.

A user identifier field 1310 of FIG. 13 indicates an identifier of a STA (i.e., receiving STA) corresponding to per user information. An example of the identifier may be the entirety or part of an association identifier (AID) value of the receiving STA.

In addition, an RU allocation field 1320 may be included. That is, when the receiving STA identified through the user identifier field 1310 transmits a TB PPDU in response to the trigger frame, the TB PPDU is transmitted through an RU indicated by the RU allocation field 1320. In this case, the RU indicated by the RU allocation field 1320 may be an RU shown in FIG. 5, FIG. 6, and FIG. 7.

The subfield of FIG. 13 may include a coding type field 1330. The coding type field 1330 may indicate a coding type of the TB PPDU. For example, when BCC coding is applied to the TB PPDU, the coding type field 1330 may be set to '1', and when LDPC coding is applied, the coding type field 1330 may be set to '0'.

In addition, the subfield of FIG. 13 may include an MCS field 1340. The MCS field 1340 may indicate an MCS scheme applied to the TB PPDU. For example, when BCC coding is applied to the TB PPDU, the coding type field 1330 may be set to '1', and when LDPC coding is applied, the coding type field 1330 may be set to '0'.

Hereinafter, a UL OFDMA-based random access (UORA) scheme will be described.

Figure 14:
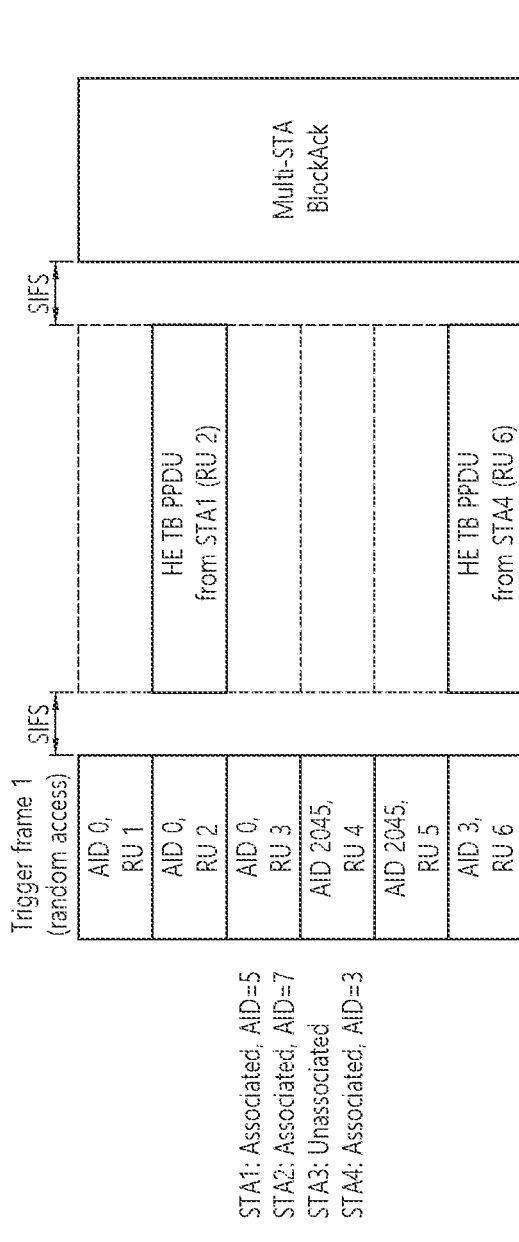
FIG. 14 describes a technical feature of the UORA scheme.

FIG. 14 describes a technical feature of the UORA scheme.

A transmitting STA (e.g., an AP) may allocate six RU resources through a trigger frame as shown in FIG. 14. Specifically, the AP may allocate a 1st RU resource (AID 0, RU 1), a 2nd RU resource (AID 0, RU 2), a 3rd RU resource (AID 0, RU 3), a 4th RU resource (AID 2045, RU 4), a 5th RU resource (AID 2045, RU 5), and a 6th RU resource (AID 3, RU 6). Information related to the AID 0, AID 3, or AID 2045 may be included, for example, in the user identifier field 1310 of FIG. 13. Information related to the RU 1 to RU 6 may be included, for example, in the RU allocation field 1320 of FIG. 13. AID=0 may imply a UORA resource for an associated STA, and AID=2045 may imply a UORA resource for an un-associated STA. Accordingly, the 1st to 3rd RU resources of FIG. 14 may be used as a UORA resource for the associated STA, the 4th and 5th RU resources of FIG. 14 may be used as a UORA resource for the un-associated STA, and the 6th RU resource of FIG. 14 may be used as a typical resource for UL MU.

In the example of FIG. 14, an OFDMA random access backoff (OBO) of a STA1 is decreased to 0, and the STA1 randomly selects the 2nd RU resource (AID 0, RU 2). In addition, since an OBO counter of a STA2/3 is greater than 0, an uplink resource is not allocated to the STA2/3. In addition, regarding a STA4 in FIG. 14, since an AID (e.g., AID=3) of the STA4 is included in a trigger frame, a resource of the RU 6 is allocated without backoff.

Specifically, since the STA1 of FIG. 14 is an associated STA, the total number of eligible RA RUs for the STA1 is 3 (RU 1, RU 2, and RU 3), and thus the STA1 decreases an OBO counter by 3 so that the OBO counter becomes 0. In addition, since the STA2 of FIG. 14 is an associated STA, the total number of eligible RA RUs for the STA2 is 3 (RU 1, RU 2, and RU 3), and thus the STA2 decreases the OBO counter by 3 but the OBO counter is greater than 0. In addition, since the STA3 of FIG. 14 is an un-associated STA, the total number of eligible RA RUs for the STA3 is 2 (RU 4, RU 5), and thus the STA3 decreases the OBO counter by 2 but the OBO counter is greater than 0.

Figure 15:
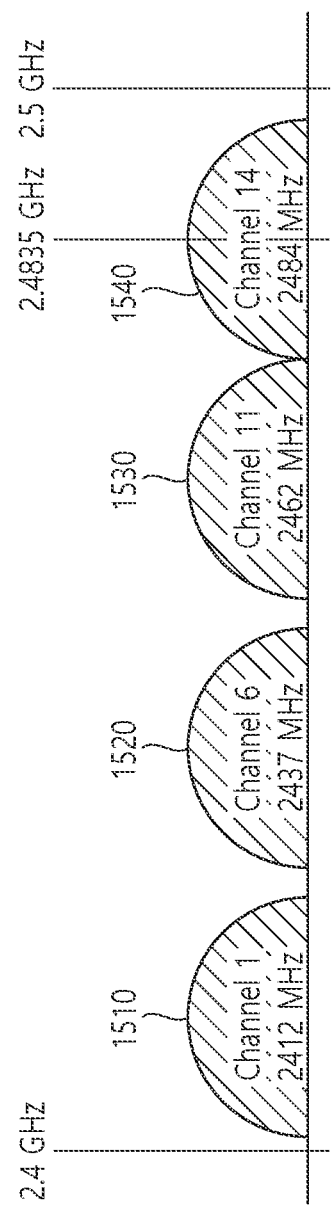
FIG. 15 illustrates an example of a channel used/supported/defined within a 2.4 GHz band.

FIG. 15 illustrates an example of a channel used/supported/defined within a 2.4 GHz band.

The 2.4 GHz band may be called in other terms such as a first band. In addition, the 2.4 GHz band may imply a frequency domain in which channels of which a center frequency is close to 2.4 GHz (e.g., channels of which a center frequency is located within 2.4 to 2.5 GHz) are used/supported/defined.

A plurality of 20 MHz channels may be included in the 2.4 GHz band. 20 MHz within the 2.4 GHz may have a plurality of channel indices (e.g., an index 1 to an index 14). For example, a center frequency of a 20 MHz channel to which a channel index 1 is allocated may be 2.412 GHz, a center frequency of a 20 MHz channel to which a channel index 2 is allocated may be 2.417 GHz, and a center frequency of a 20 MHz channel to which a channel index N is allocated may be (2.407+0.005*N) GHz. The channel index may be called in various terms such as a channel number or the like. Specific numerical values of the channel index and center frequency may be changed.

FIG. 15 exemplifies 4 channels within a 2.4 GHz band. Each of 1st to 4th frequency domains 1510 to 1540 shown herein may include one channel. For example, the 1st frequency domain 1510 may include a channel 1 (a 20 MHz channel having an index 1). In this case, a center frequency of the channel 1 may be set to 2412 MHz. The 2nd frequency domain 1520 may include a channel 6. In this case, a center frequency of the channel 6 may be set to 2437 MHz. The 3rd frequency domain 1530 may include a channel 11. In this case, a center frequency of the channel 11 may be set to 2462 MHz. The 4th frequency domain 1540 may include a channel 14. In this case, a center frequency of the channel 14 may be set to 2484 MHz.

Figure 16:
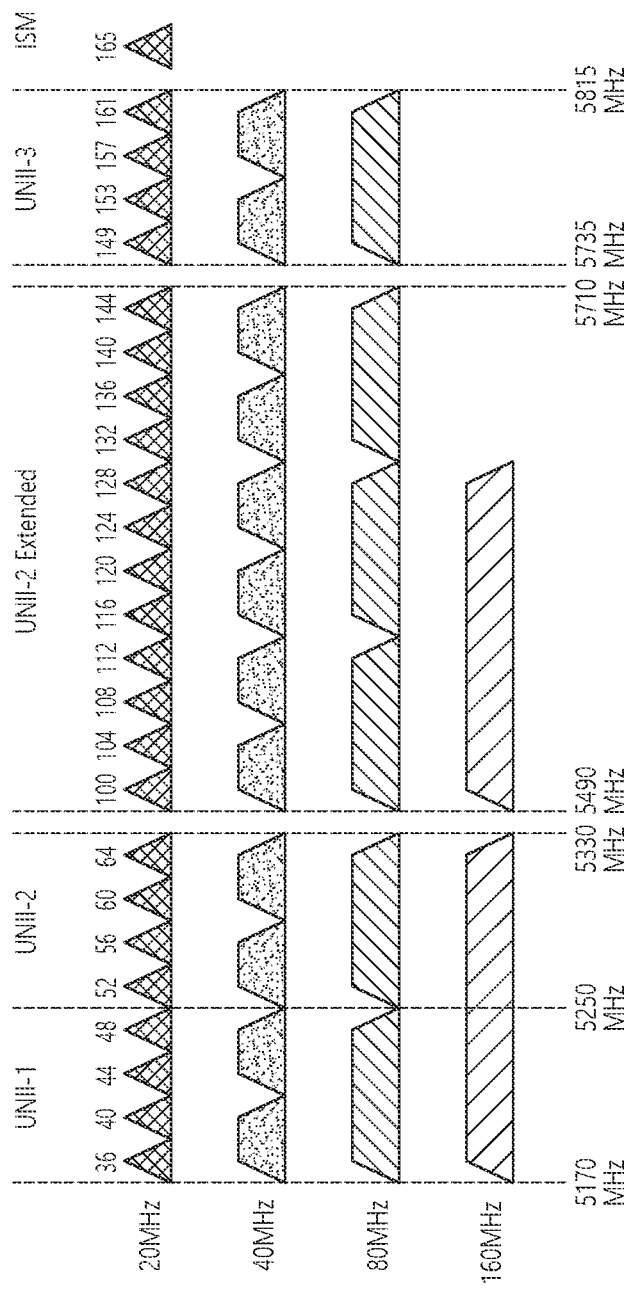
FIG. 16 illustrates an example of a channel used/supported/defined within a 5 GHz band.

FIG. 16 illustrates an example of a channel used/supported/defined within a 5 GHz band.

The 5 GHz band may be called in other terms such as a second band or the like. The 5 GHz band may imply a frequency domain in which channels of which a center frequency is greater than or equal to 5 GHz and less than 6 GHz (or less than 5.9 GHz) are used/supported/defined. Alternatively, the 5 GHz band may include a plurality of channels between 4.5 GHz and 5.5 GHz. A specific numerical value shown in FIG. 16 may be changed.

A plurality of channels within the 5 GHz band include an unlicensed national information infrastructure (UNII)-1, a UNII-2, a UNII-3, and an ISM. The INII-1 may be called UNII Low. The UNII-2 may include a frequency domain called UNII Mid and UNII-2Extended. The UNII-3 may be called UNII-Upper.

A plurality of channels may be configured within the 5 GHz band, and a bandwidth of each channel may be variously set to, for example, 20 MHz, 40 MHz, 80 MHz, 160 MHz, or the like. For example, 5170 MHz to 5330 MHz frequency domains/ranges within the UNII-1 and UNII-2 may be divided into eight 20 MHz channels. The 5170 MHz to 5330 MHz frequency domains/ranges may be divided into four channels through a 40 MHz frequency domain. The 5170 MHz to 5330 MHz frequency domains/ranges may be divided into two channels through an 80 MHz frequency domain. Alternatively, the 5170 MHz to 5330 MHz frequency domains/ranges may be divided into one channel through a 160 MHz frequency domain.

Figure 17:
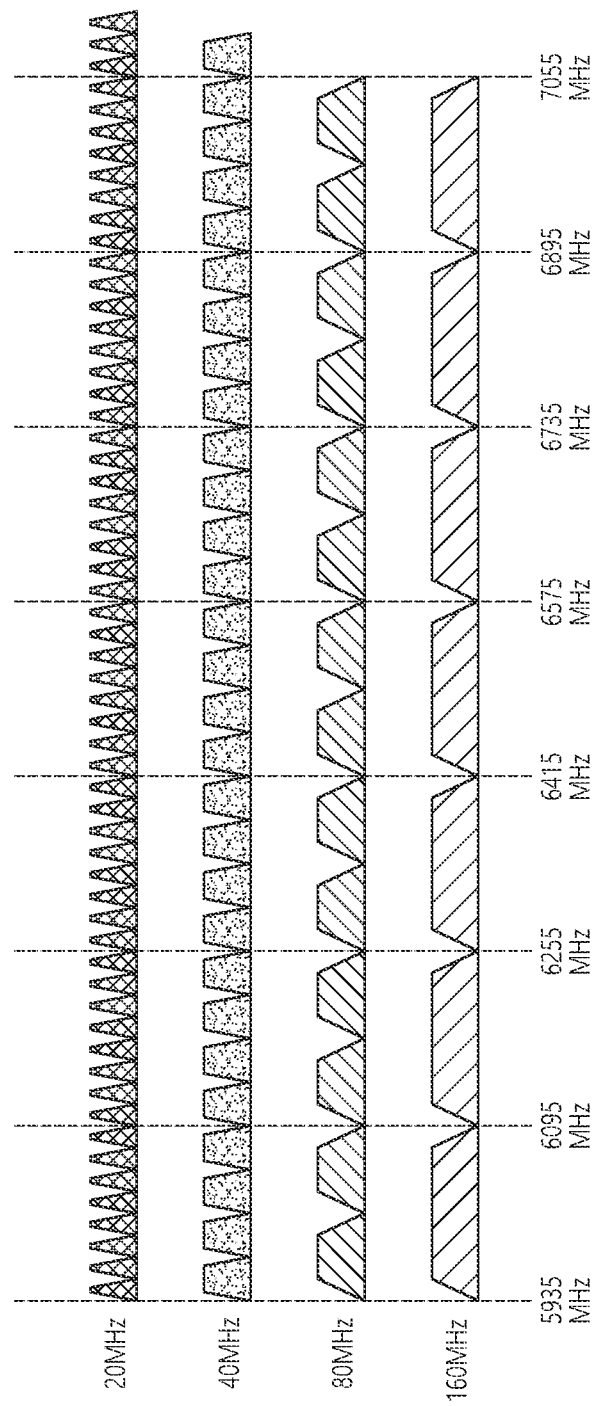
FIG. 17 illustrates an example of a channel used/supported/defined within a 6 GHz band.

FIG. 17 illustrates an example of a channel used/supported/defined within a 6 GHz band.

The 6 GHz band may be called in other terms such as a third band or the like. The 6 GHz band may imply a frequency domain in which channels of which a center frequency is greater than or equal to 5.9 GHz are used/supported/defined. A specific numerical value shown in FIG. 17 may be changed.

For example, the 20 MHz channel of FIG. 17 may be defined starting from 5.940 GHz. Specifically, among 20 MHz channels of FIG. 17, the leftmost channel may have an index 1 (or a channel index, a channel number, etc.), and 5.945 GHz may be assigned as a center frequency. That is, a center frequency of a channel of an index N may be determined as (5.940+0.005*N) GHz.

Accordingly, an index (or channel number) of the 2 MHz channel of FIG. 17 may be 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 181, 185, 189, 193, 197, 201, 205, 209, 213, 217, 221, 225, 229, 233. In addition, according to the aforementioned (5.940+0.005*N)GHz rule, an index of the 40 MHz channel of FIG. 17 may be 3, 11, 19, 27, 35, 43, 51, 59, 67, 75, 83, 91, 99, 107, 115, 123, 131, 139, 147, 155, 163, 171, 179, 187, 195, 203, 211, 219, 227.

Although 20, 40, 80, and 160 MHz channels are illustrated in the example of FIG. 17, a 240 MHz channel or a 320 MHz channel may be additionally added.

Hereinafter, a PPDU transmitted/received in a STA of the present specification will be described.

FIG. 18 illustrates an example of a PPDU used in the present specification.

The PPDU 1800 depicted in FIG. 18 may be referred to as various terms such as an EHT PPDU, a TX PPDU, an RX PPDU, a first type or N-th type PPDU, or the like. In addition, the EHT PPDU may be used in an EHT system and/or a new WLAN system enhanced from the EHT system.

The subfields 1801 to 1810 depicted in FIG. 18 may be referred to as various terms. For example, a SIG A field 1805 may be referred to an EHT-SIG-A field, a SIG B field 1806 may be referred to an EHT-SIG-B, a STF field 1807 may be referred to an EHT-STF field, and an LTF field 1808 may be referred to an EHT-LTF.

The subcarrier spacing of the L-LTF, L-STF, L-SIG, and RL-SIG fields 1801, 1802, 1803, and 1804 of FIG. 18 can be set to 312.5 kHz, and the subcarrier spacing of the STF, LTF, and Data fields 1807, 1808, and 1809 of FIG. 18 can be set to 78.125 kHz. That is, the subcarrier index of the L-LTF, L-STF, L-SIG, and RL-SIG fields 1801, 1802, 1803, and 1804 can be expressed in unit of 312.5 kHz, and the subcarrier index of the STF, LTF, and Data fields 1807, 1808, and 1809 can be expressed in unit of 78.125 kHz.

The SIG A and/or SIG B fields of FIG. 18 may include additional fields (e.g., a SIG C field or one control symbol, etc.). The subcarrier spacing of all or part of the SIG A and SIG B fields may be set to 312.5 kHz, and the subcarrier spacing of all or part of newly-defined SIG field(s) may be set to 312.5 kHz. Meanwhile, the subcarrier spacing for a part of the newly-defined SIG field(s) may be set to a pre-defined value (e.g., 312.5 kHz or 78.125 kHz).

In the PPDU of FIG. 18, the L-LTF and the L-STF may be the same as conventional L-LTF and L-STF fields.

The L-SIG field of FIG. 18 may include, for example, bit information of 24 bits. For example, the 24-bit information may include a rate field of 4 bits, a reserved bit of 1 bit, a length field of 12 bits, a parity bit of 1 bit, and a tail bit of 6 bits. For example, the length field of 12 bits may include information related to the number of octets of a corresponding Physical Service Data Unit (PSDU). For example, the length field of 12 bits may be determined based on a type of the PPDU. For example, when the PPDU is a non-HT, HT, VHT PPDU or an EHT PPDU, a value of the length field may be determined as a multiple of 3. For example, when the PPDU is an HE PPDU, the value of the length field may be determined as 'a multiple of 3+1' or 'a multiple of 3+2'. In other words, for the non-HT, HT, VHT PPDI or the EHT PPDU, the value of the length field may be determined as a multiple of 3, and for the HE PPDU, the value of the length field may be determined as 'a multiple of 3+1' or 'a multiple of 3+2'.

For example, the transmitting STA may apply BCC encoding based on a 1/2 coding rate to the 24-bit information of the L-SIG field. Thereafter, the transmitting STA may obtain a BCC coding bit of 48 bits. BPSK modulation may be applied to the 48-bit coding bit, thereby generating 48 BPSK symbols. The transmitting STA may map the 48 BPSK symbols to positions except for a pilot subcarrier {subcarrier index −21, −7, +7, +21} and a DC subcarrier {subcarrier index 0}. As a result, the 48 BPSK symbols may be mapped to subcarrier indices −26 to −22, −20 to −8, −6 to −1, +1 to +6, +8 to +20, and +22 to +26. The transmitting STA may additionally map a signal of {−1, −1, −1, 1} to a subcarrier index {−28, −27, +27, +28}. The aforementioned signal may be used for channel estimation on a frequency domain corresponding to {−28, −27, +27, +28}.

The transmitting STA may generate an RL-SIG which is identical to the L-SIG. BPSK modulation may be applied to the RL-SIG. The receiving STA may figure out that the RX PPDU is the HE PPDU or the EHT PPDU, based on the presence of the RL-SIG.

After RL-SIG in FIG. 18, for example, EHT-SIG-A or one control symbol may be inserted. A symbol located after the RL-SIG (i.e., EHT-SIG-A or one control symbol in the present specification) may be called by various names such as a Universal SIG (U-SIG) field.

A symbol consecutive to the RL-SIG (for example, U-SIG) may include N bits information, and may include information for identifying the type of the EHT PPDU. For example, the U-SIG may be configured based on two symbols (for example, two consecutive OFDM symbols). Each symbol (for example, OFDM symbol) for U-SIG may have a duration of 4 μs. Each symbol of the U-SIG may be used to transmit 26-bits information. For example, each symbol of the U-SIG may be transmitted/received based on 52 data tones and 4 pilot tones.

For example, A-bit information (for example, 52 un-coded bits) may be transmitted through the U-SIG (or U-SIG field). The first X-bit information of the total A-bit information (for example, 26 un-coded bits) may be transmitted through the first symbol of the U-SIG, and the remaining Y-bit information of the total A-bit information (for example, 26 un-coded bits) may be transmitted through the second symbol of the U-SIG. For example, the transmitting STA may obtain 26 un-coded bits included in each U-SIG symbol. The transmitting STA may generate a 52-coded bit by performing convolutional encoding based on a rate of R=1/2, and may perform interleaving on the 52-coded bit. The transmitting STA may generate 52 BPSK symbols allocated to each U-SIG symbol by performing BPSK modulation on the interleaved 52-coded bits. One U-SIG symbol may be transmitted based on 56 tones (subcarriers) from subcarrier index −28 to subcarrier index +28 except for DC index 0. The 52 BPSK symbols generated by the transmitting STA may be transmitted based on the remaining tones (subcarriers) excluding pilot tones −21, −7, +7, and +21 tones.

For example, A-bit information (for example, 52 un-coded bits) transmitted by U-SIG may include a CRC field (for example, a 4-bit long field) and a tail field (for example, a 6-bit long field). The CRC field and the tail field may be transmitted through the second symbol of the U-SIG. The CRC field may be generated based on the 26 bits allocated to the first symbol of the U-SIG, and the remaining 16 bits in the second symbol except for the CRC/tail field, and may be generated based on the conventional CRC calculation algorithm. Also, the tail field may be used to terminate the trellis of the convolutional decoder, and may be set to, for example, "000000".

A bit information (for example, 52 un-coded bits) transmitted by U-SIG (or U-SIG field) may be divided into version-independent bits and version-dependent bits. For example, the size of version-independent bits may be fixed or variable. For example, the version-independent bits may be allocated only to the first symbol of the U-SIG, or the version-independent bits may be allocated to both the first symbol and the second symbol of the U-SIG. For example, the version-independent bits and the version-dependent bits may be referred to by various names such as a first bit and a second bit.

For example, the version-independent bits of the U-SIG may include a 3-bit PHY version identifier. For example, the 3-bit PHY version identifier may include information related to the PHY version of the transmission/reception PPDU. For example, the first value of the 3-bit PHY version identifier may indicate that the transmission/reception PPDU is an EHT PPDU. In other words, when transmitting the EHT PPDU, the transmitting STA may set the 3-bit PHY version identifier as the first value. In other words, the receiving STA may determine that the receiving PPDU is an EHT PPDU based on the PHY version identifier having the first value.

For example, the version-independent bits of the U-SIG may include a 1-bit UL/DL flag field. A first value of the 1-bit UL/DL flag field relates to UL communication, and a second value of the UL/DL flag field relates to DL communication.

For example, the version-independent bits of the U-SIG may include information about the length of the TXOP and information about the BSS color ID.

For example, when EHT PPDU is divided into various types (for example, EHT PPDU supporting SU, EHT PPDU supporting MU, EHT PPDU related to Trigger Frame, EHT PPDU related to Extended Range transmission, etc.), information on the type of the EHT PPDU may be included in version-independent bits or version-dependent bits of the U-SIG.

For example, the U-SIG field includes information on 1) a bandwidth field including information about bandwidth, 2) a field containing information about the MCS technique applied to SIG-B, 3) an indication field including information related to whether a dual subcarrier modulation technique is applied to SIG-B, 4) a field including information about the number of symbols used for SIG-B, 5) a field including information on whether SIG-B is generated over the entire band, 6) a field including information about the type of LTF/STF, and 7) a field indicating LTF length and CP length.

The SIG-B of FIG. 18 may include the technical features of the HE-SIG-B shown in the examples of FIGS. 8 and 9.

An STF of FIG. 18 may be used to improve automatic gain control estimation in a multiple input multiple output (MIMO) environment or an OFDMA environment. An LTF of FIG. 18 may be used to estimate a channel in the MIMO environment or the OFDMA environment.

The EHT-STF of FIG. 18 may be set in various types. For example, a first type of STF (e.g., 33 STF) may be generated based on a first type STF sequence in which a non-zero coefficient is arranged with an interval of 16 subcarriers. An STF signal generated based on the first type STF sequence may have a period of 0.8 μs, and a periodicity signal of 0.8 μs may be repeated 5 times to become a first type STF having a length of 4 μs. For example, a second type of STF (e.g., 2× STF) may be generated based on a second type STF sequence in which a non-zero coefficient is arranged with an interval of 8 subcarriers. An STF signal generated based on the second type STF sequence may have a period of 1.6 μs, and a periodicity signal of 1.6 μs may be repeated 5 times to become a second type STF having a length of 8 μs. For example, a third type of STF (e.g., 4× STF) may be generated based on a third type STF sequence in which a non-zero coefficient is arranged with an interval of 4 subcarriers. An STF signal generated based on the third type STF sequence may have a period of 3.2 μs, and a periodicity signal of 3.2 μs may be repeated 5 times to become a second type STF having a length of 16 μs. Only some of the first to third type EHT-STF sequences may be used. In addition, the EHT-LTF field may also have first, second, and third types (i.e., 1×, 2×, 4× LTF). For example, the first/second/third type LTF field may be generated based on an LTF sequence in which a non-zero coefficient is arranged with an interval of 4/2/1 subcarriers. The first/second/third type LTF may have a time length of 3.2/6.4/12.8 μs. In addition, Guard Intervals (GIs) with various lengths (e.g., 0.8/1/6/3.2 μs) may be applied to the first/second/third type LTF.

Information related to the type of STF and/or LTF (including information related to GI applied to the LTF) may be included in the SIG A field and/or the SIG B field of FIG. 18.

The PPDU of FIG. 18 may support various bandwidths. For example, the PPDU of FIG. 18 may have a bandwidth of 20/40/80/160/240/320 MHz. For example, at least one field (e.g., STF, LTF, data) of FIG. 18 may be configured based on RUs illustrated in FIGS. 5 to 7, and the like. For example, when there is one receiving STA of the PPDU of FIG. 18, all fields of the PPDU of FIG. 18 may occupy the entire bandwidth. For example, when there are multiple receiving STAs of the PPDU of FIG. 18 (i.e., when MU PPDU is used), some fields (e.g., STF, LTF, data) of FIG. 18 may be configured based on the RUs shown in FIGS. 5 to 7. For example, the STF, LTF, and data fields for the first receiving STA of the PPDU may be transmitted/received through a first RU, and the STF, LTF, and data fields for the second receiving STA of the PPDU may be transmitted/received through a second RU. In this case, the locations/positions of the first and second RUs may be determined based on FIGS. 5 to 7, and the like.

The PPDU of FIG. 18 may be determined (or identified) as an EHT PPDU based on the following method.

A receiving STA may determine a type of an RX PPDU as the EHT PPDU, based on the following aspect. For example, the RX PPDU may be determined as the EHT PPDU: 1) when a first symbol after an L-LTF signal of the RX PPDU is a BPSK symbol; 2) when RL-SIG in which the L-SIG of the RX PPDU is repeated is detected; and 3) when a result of applying "module 3" to a value of a length field of the L-SIG of the RX PPDU is detected as "0". When the RX PPDU is determined as the EHT PPDU, the receiving STA may detect a type of the EHT PPDU (e.g., an SU/MU/Trigger-based/Extended Range type), based on bit information included in a symbol after the RL-SIG of FIG. 18. In other words, the receiving STA may determine the RX PPDU as the EHT PPDU, based on: 1) a first symbol after an L-LTF signal, which is a BPSK symbol; 2) RL-SIG contiguous to the L-SIG field and identical to L-SIG; 3) L-SIG including a length field in which a result of applying "modulo 3" is set to "0"; and 4) a 3-bit PHY version identifier of the aforementioned U-SIG (e.g., a PHY version identifier having a first value).

For example, the receiving STA may determine the type of the RX PPDU as the EHT PPDU, based on the following aspect. For example, the RX PPDU may be determined as the HE PPDU: 1) when a first symbol after an L-LTF signal is a BPSK symbol; 2) when RL-SIG in which the L-SIG is repeated is detected; and 3) when a result of applying "module 3" to a value of a length field of the L-SIG is detected as "1" or "2".

For example, the receiving STA may determine the type of the RX PPDU as a non-HT, HT, and VHT PPDU, based on the following aspect. For example, the RX PPDU may be determined as the non-HT, HT, and VHT PPDU: 1) when a first symbol after an L-LTF signal is a BPSK symbol; and 2) when RL-SIG in which L-SIG is repeated is not detected. In addition, even if the receiving STA detects that the RL-SIG is repeated, when a result of applying "modulo 3" to the length value of the L-SIG is detected as "0", the RX PPDU may be determined as the non-HT, HT, and VHT PPDU.

In the following example, a signal represented as a (TX/RX/UL/DL) signal, a (TX/RX/UL/DL) frame, a (TX/RX/UL/DL) packet, a (TX/RX/UL/DL) data unit, (TX/RX/UL/DL) data, or the like may be a signal transmitted/received based on the PPDU of FIG. 18. The PPDU of FIG. 18 may be used to transmit/receive frames of various types. For example, the PPDU of FIG. 18 may be used for a control frame. An example of the control frame may include a request to send (RTS), a clear to send (CTS), a power save-poll (PS-poll), BlockACKReq, BlockAck, a null data packet (NDP) announcement, and a trigger frame. For example, the PPDU of FIG. 18 may be used for a management frame. An example of the management frame may include a beacon frame, a (re-)association request frame, a (re-)association response frame, a probe request frame, and a probe response frame. For example, the PPDU of FIG. 18 may be used for a data frame. For example, the PPDU of FIG. 18 may be used to simultaneously transmit at least two or more of the control frame, the management frame, and the data frame.

Figure 19:
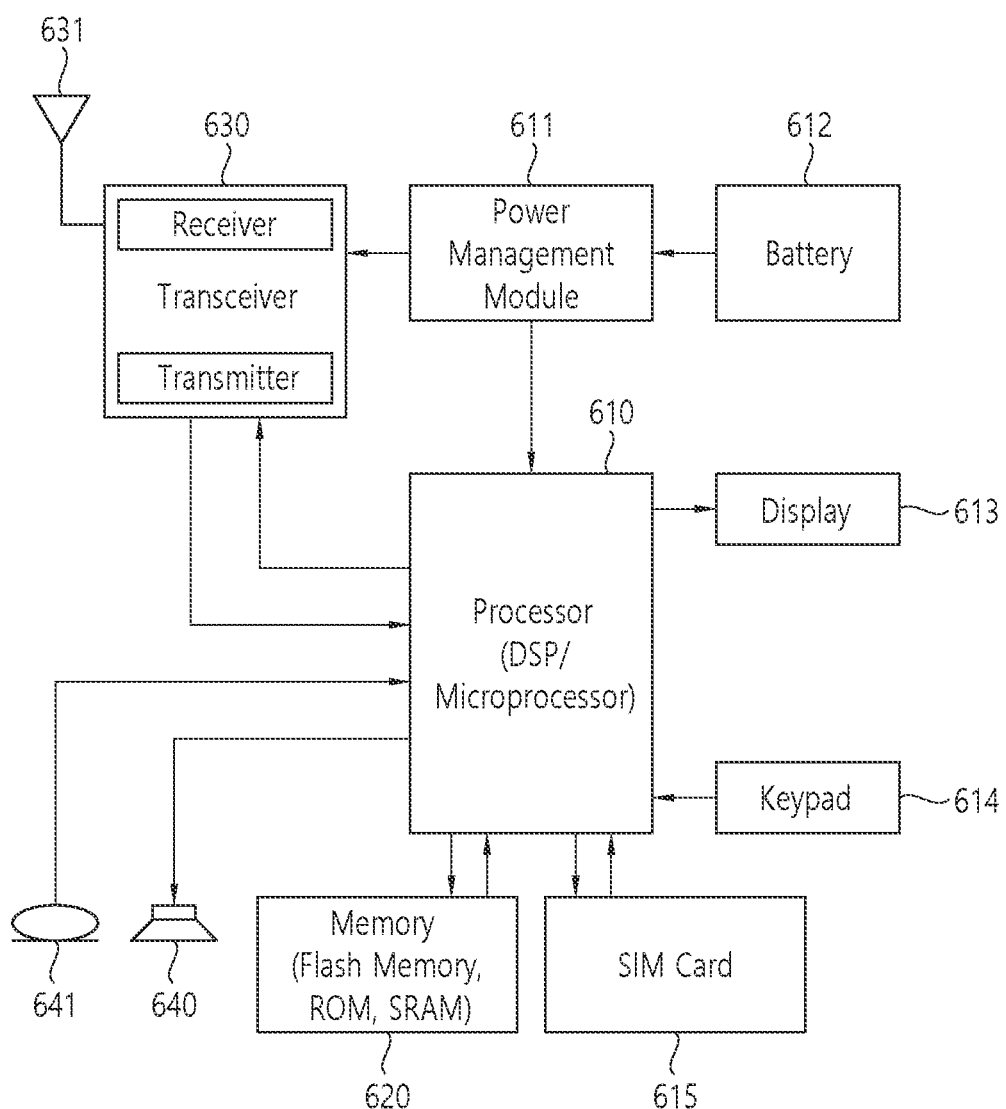
FIG. 19 illustrates an example of a modified transmission device and/or receiving device of the present specification.

FIG. 19 illustrates an example of a modified transmission device and/or receiving device of the present specification.

Each device/STA of the sub-figure (a)/(b) of FIG. 1 may be modified as shown in FIG. 19. A transceiver 630 of FIG. 19 may be identical to the transceivers 113 and 123 of FIG. 1. The transceiver 630 of FIG. 19 may include a receiver and a transmitter.

A processor 610 of FIG. 19 may be identical to the processors 111 and 121 of FIG. 1. Alternatively, the processor 610 of FIG. 19 may be identical to the processing chips 114 and 124 of FIG. 1.

A memory 620 of FIG. 19 may be identical to the memories 112 and 122 of FIG. 1. Alternatively, the memory 620 of FIG. 19 may be a separate external memory different from the memories 112 and 122 of FIG. 1.

Referring to FIG. 19, a power management module 611 manages power for the processor 610 and/or the transceiver 630. A battery 612 supplies power to the power management module 611. A display 613 outputs a result processed by the processor 610. A keypad 614 receives inputs to be used by the processor 610. The keypad 614 may be displayed on the display 613. A SIM card 615 may be an integrated circuit which is used to securely store an international mobile subscriber identity (IMSI) and its related key, which are used to identify and authenticate subscribers on mobile telephony devices such as mobile phones and computers.

Referring to FIG. 19, a speaker 640 may output a result related to a sound processed by the processor 610. A microphone 641 may receive an input related to a sound to be used by the processor 610.

Figure 20:
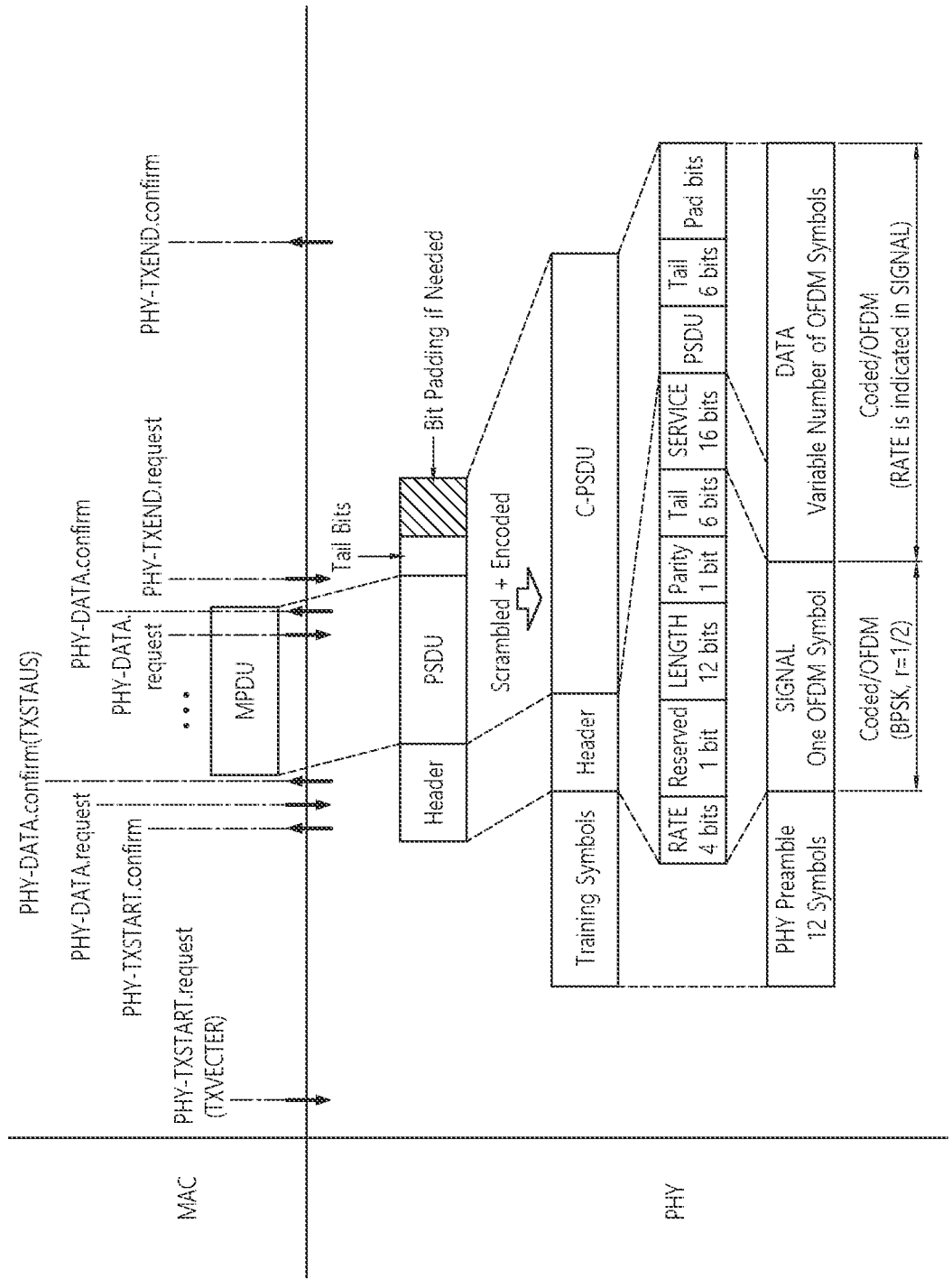
FIG. 20 is a diagram for explaining an operation of a transmitting STA that generates a PPDU based on a Single-MPDU.

FIG. 20 is a diagram for explaining an operation of a transmitting STA that generates a PPDU based on a Single-MPDU.

Referring to FIG. 20, a layer architecture of a transmitting STA (i.e., an IEEE 802.11 system) may include a Medium Access Control (MAC) layer (or sublayer) and a Physical (PHY) layer (or sublayer).

The transmitting STA (for example, the first STA 110 of FIG. 1) may generate/configure an MPDU through a Medium Access Control (MAC) layer. The PHY layer may provide an interface to the MAC layer through TXVECTOR, RXVECTOR, and PHYCONFIG_VECTOR. TXVECTOR may support transmission parameters for each PPDU to the PHY layer. TXVECTOR may be delivered from the MAC layer to the PHY layer through the PHY-TXSTART.request primitive. By using the PHYCONFIG_VECTOR by the transmitting STA, the MAC layer may configure the operation of the PHY layer regardless of frame transmission or reception.

An operation in each sub-layer (or layer) will be briefly described as follows.

The MAC layer may generate one or more MAC protocol data units (MPDUs) by attaching a MAC header and a frame check sequence (FCS) to a MAC service data unit (MSDU) or a fragment of an MSDU received from a higher layer (for example, LLC). The generated MPDU may be delivered to the PHY layer.

The PHY layer may generate a physical protocol data unit (PPDU) by adding an additional field including information required by the physical layer of a transmitting/receiving STA to the physical service data unit (PSDU) received from the MAC layer. The generated PPDU may be transmitted through a wireless medium.

Since the PSDU is received by the PHY layer from the MAC and the MPDU is transmitted by the MAC layer to the PHY layer, the PSDU may be substantially the same as the MPDU.

Figure 21:
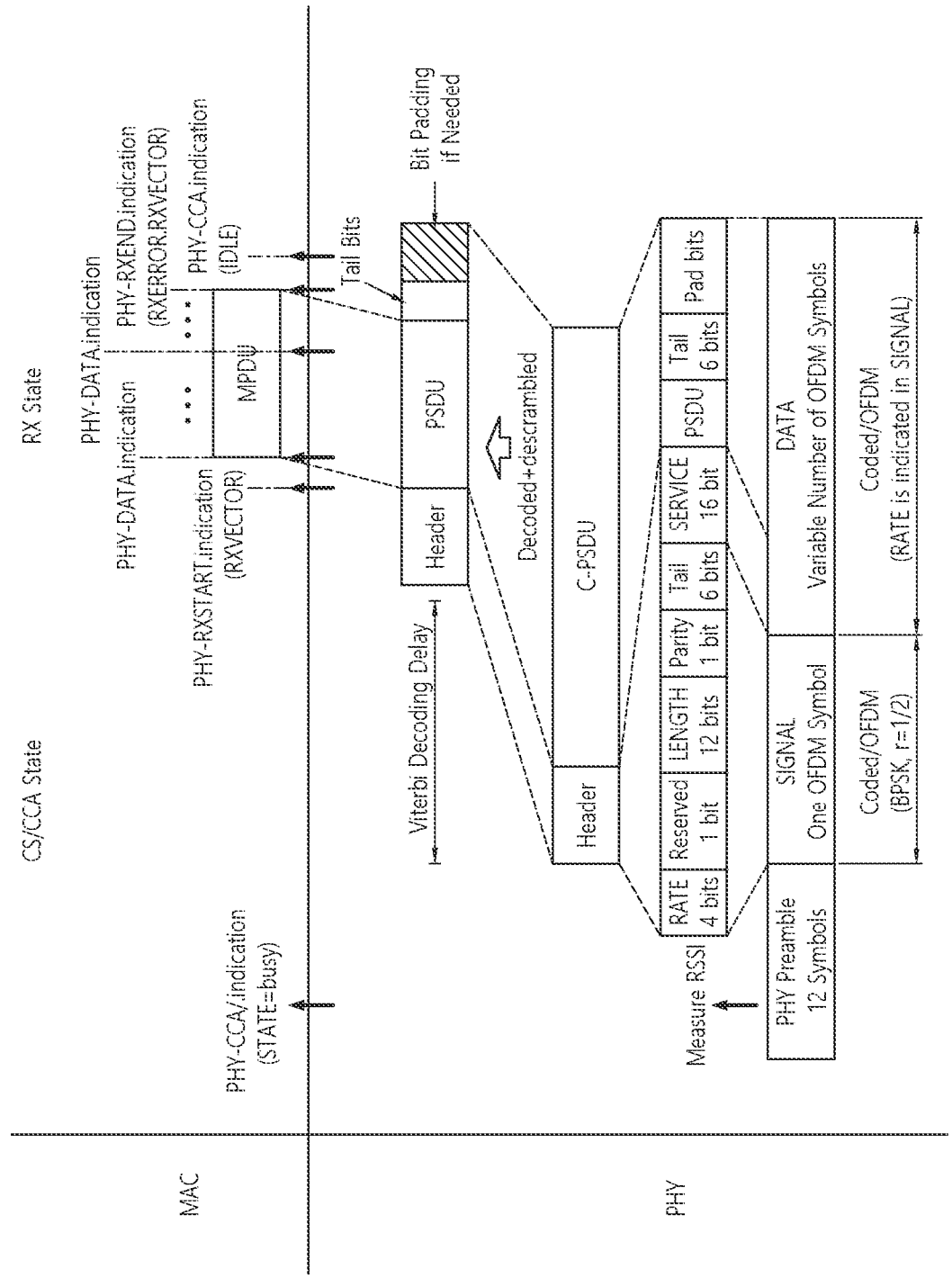
FIG. 21 is a diagram for explaining an operation of a receiving STA that receives a PPDU generated based on a Single-MPDU.

FIG. 21 is a diagram for explaining an operation of a receiving STA that receives a PPDU generated based on a Single-MPDU.

Referring to FIG. 21, a receiving STA (for example, the second STA 120 of FIG. 1) may receive a PPDU through a PHY layer. The receiving STA may have the same structure of the transmitting STA of FIG. 19, and may perform the reverse operation of generating the PPDU by the transmitting STA. That is, the receiving STA may obtain the MPDU through the received PPDU.

Specifically, by using the reception RXVECTOR, the PHY layer may inform the MAC layer parameters for the received PPDU. RXVECTOR may be delivered from the PHY layer to the MAC layer through the PHY-RXSTART.indication primitive. The receiving STA may obtain an MPDU included in the received PPDU. The receiving STA may check whether there is an error in the MPDU by using the CRC of the MPDU.

Figure 22:
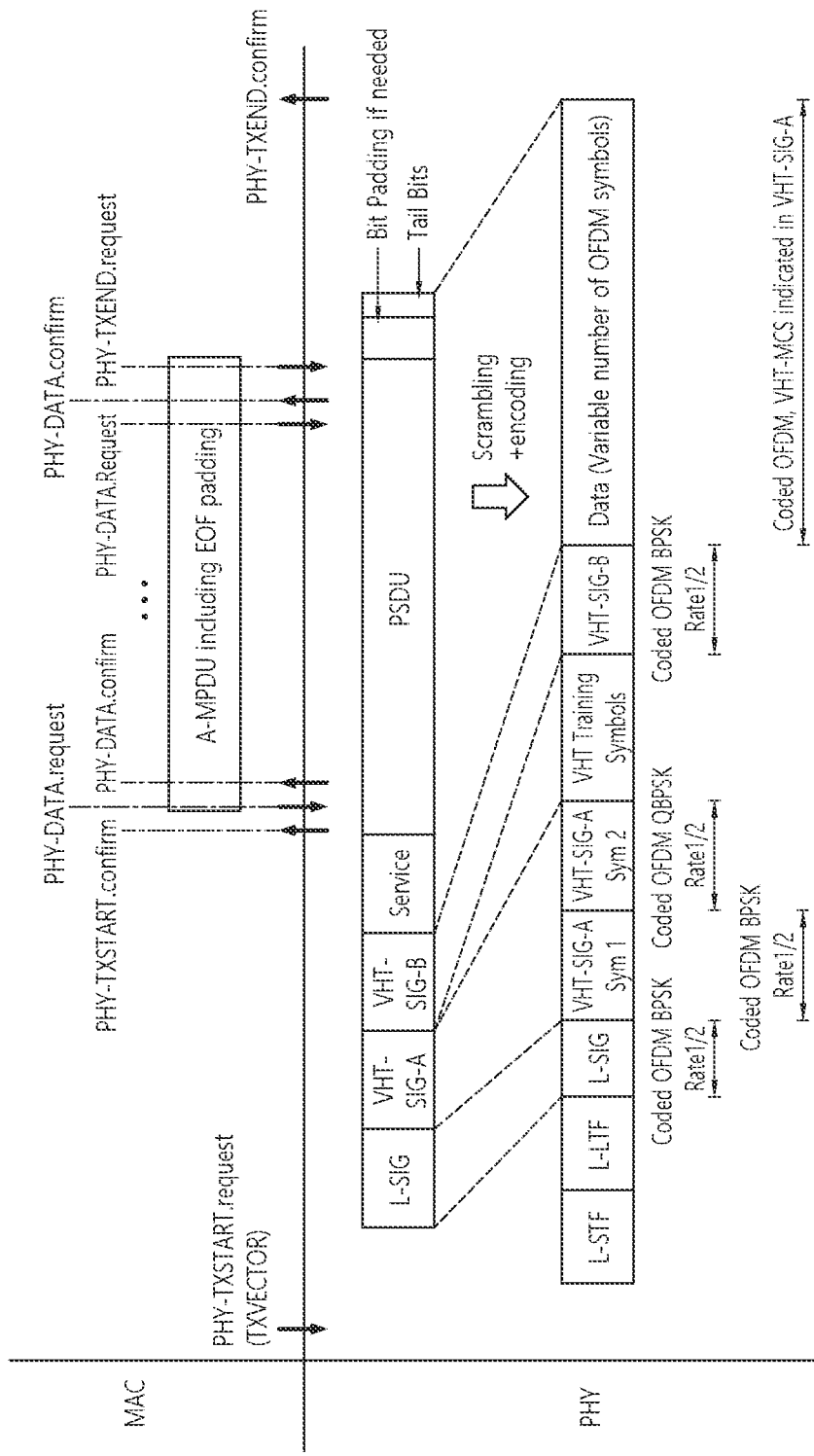
FIG. 22 is a diagram for explaining an operation of a transmitting STA that generates a PPDU based on an A-MPDU.

FIG. 22 is a diagram for explaining an operation of a transmitting STA that generates a PPDU based on an A-MPDU.

Referring to FIG. 22, a transmitting STA may include the same structure of a transmitting STA of FIG. 19. When an aggregated MPDU (A-MPDU) scheme is used, a plurality of MPDUs may be aggregated into a single A-MPDU. The MPDU aggregation operation may be performed in the MAC layer. In the A-MPDU, various types of MPDUs (for example, QoS data, Acknowledge (ACK), block ACK (BlockAck), etc.) may be merged. The PHY layer may receive an A-MPDU as a single PSDU from a MAC layer. That is, the PSDU may consist of a plurality of MPDUs. Accordingly, the A-MPDU may be transmitted through the wireless medium within a single PPDU. The transmitting STA may transmit a PPDU generated based on the A-MPDU to the receiving STA.

Figure 23:
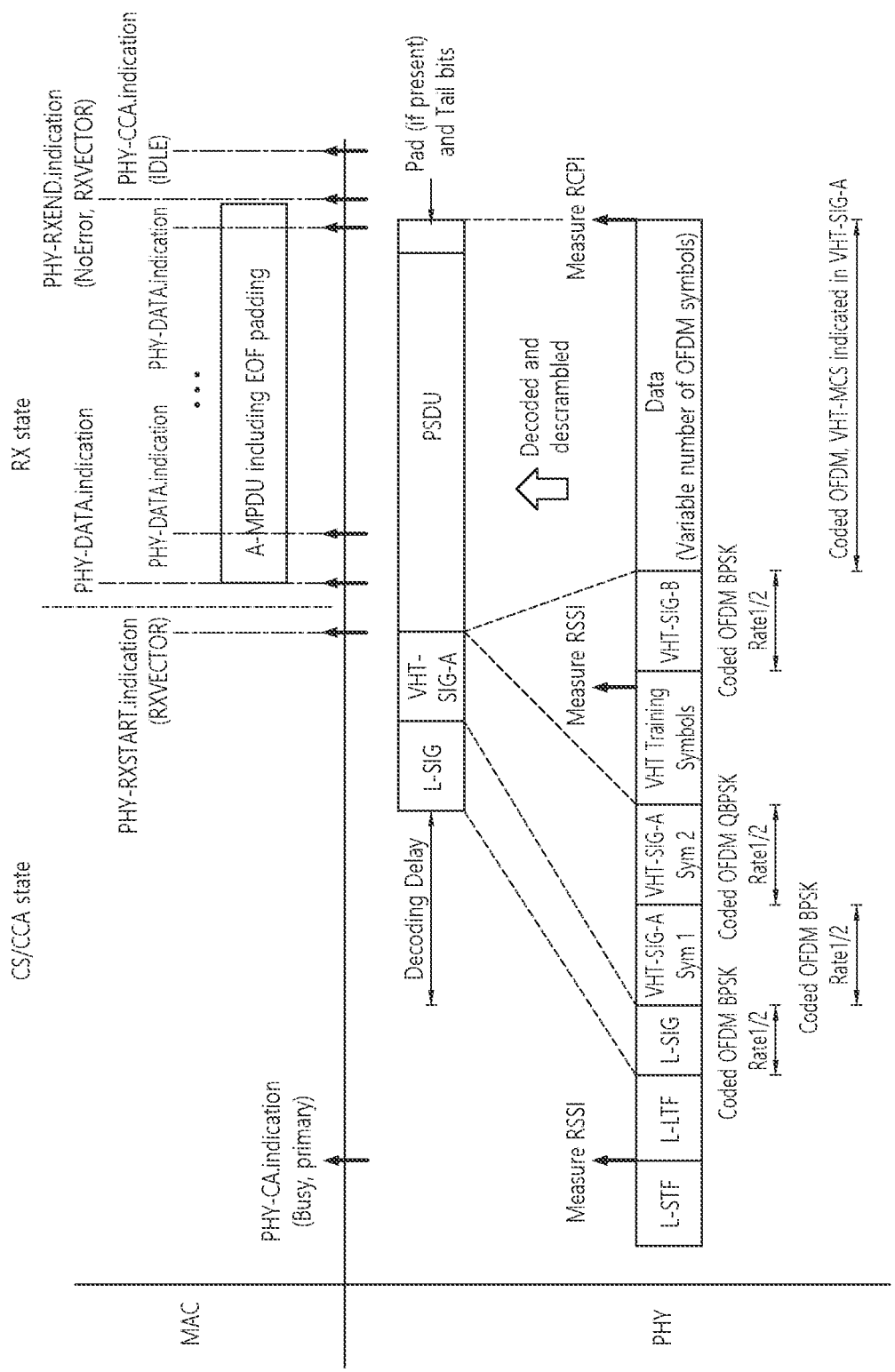
FIG. 23 is a diagram for explaining an operation of a receiving STA that receives a PPDU generated based on an A-MPDU.

FIG. 23 is a diagram for explaining an operation of a receiving STA that receives a PPDU generated based on an A-MPDU.

Referring to FIG. 23, a receiving STA (for example, the second STA 120 of FIG. 1) may receive a PPDU through a PHY layer. The receiving STA may include the same structure of a transmitting STA of FIG. 19. Upon receiving the PPDU, the receiving STA may obtain an A-MPDU. The receiving STA may determine whether each MPDU has an error by using the CRC of each MPDU constituting the A-MPDU.

Hereinafter, the HARQ technique applied to an example of the present specification will be described.

The HARQ technique may be a technique combining a forward error correction (FEC) scheme and an automatic repeat request (ARQ) scheme. According to the HARQ method, the performance can be improved by checking whether the data received by the PHY layer includes an error that cannot be decoded, and requesting retransmission when an error occurs.

The receiver supporting HARQ may basically attempt error correction on received data and determine whether to retransmit using an error detection code. The error detection code may be various codes. For example, in the case of using a cyclic redundancy check (CRC), when an error in received data is detected through a CRC detection process, the receiver may transmit a non-acknowledgement or negative-acknowledgement (NACK) signal to the transmitter. Upon receiving the NACK signal, the transmitter may transmit appropriate retransmission data according to the HARQ mode. The receiver receiving the retransmission data may improve reception performance by combining and decoding the previous data and the retransmitted data.

The mode of HARQ can be divided into chase combining and incremental redundancy (IR). Chase combining is a method of obtaining a signal-to-noise ratio (SNR) gain by combining data with detected errors with retransmitted data without discarding the data. IR is a method in which additional redundant information is incrementally attached to retransmitted data in order to obtain a coding gain.

Figure 24:
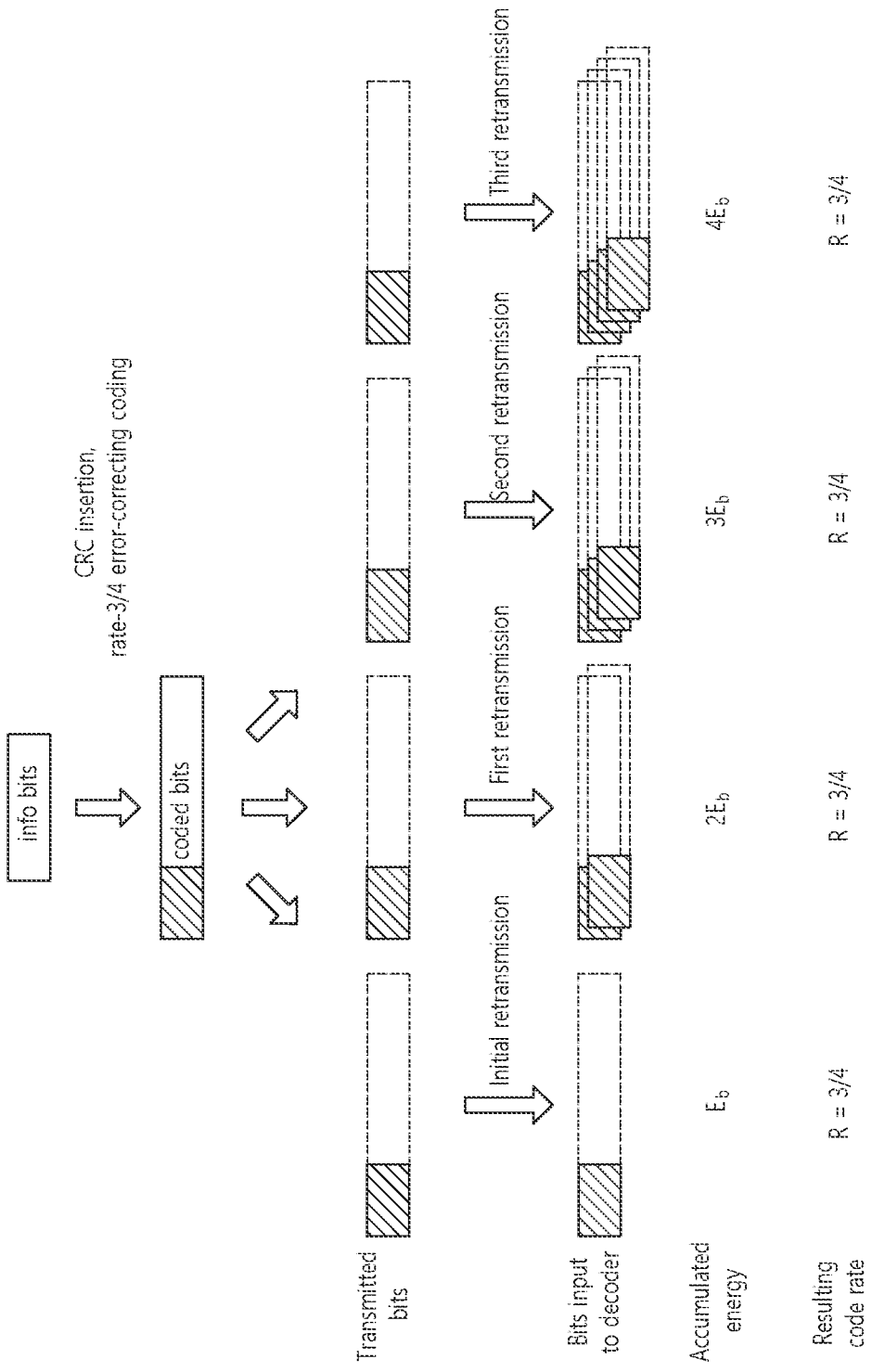
FIG. 24 is a diagram showing an example of chase combining.

FIG. 24 is a diagram showing an example of chase combining. Chase combining is a method in which the same coded bit as in the initial transmission is retransmitted.

Figure 25:
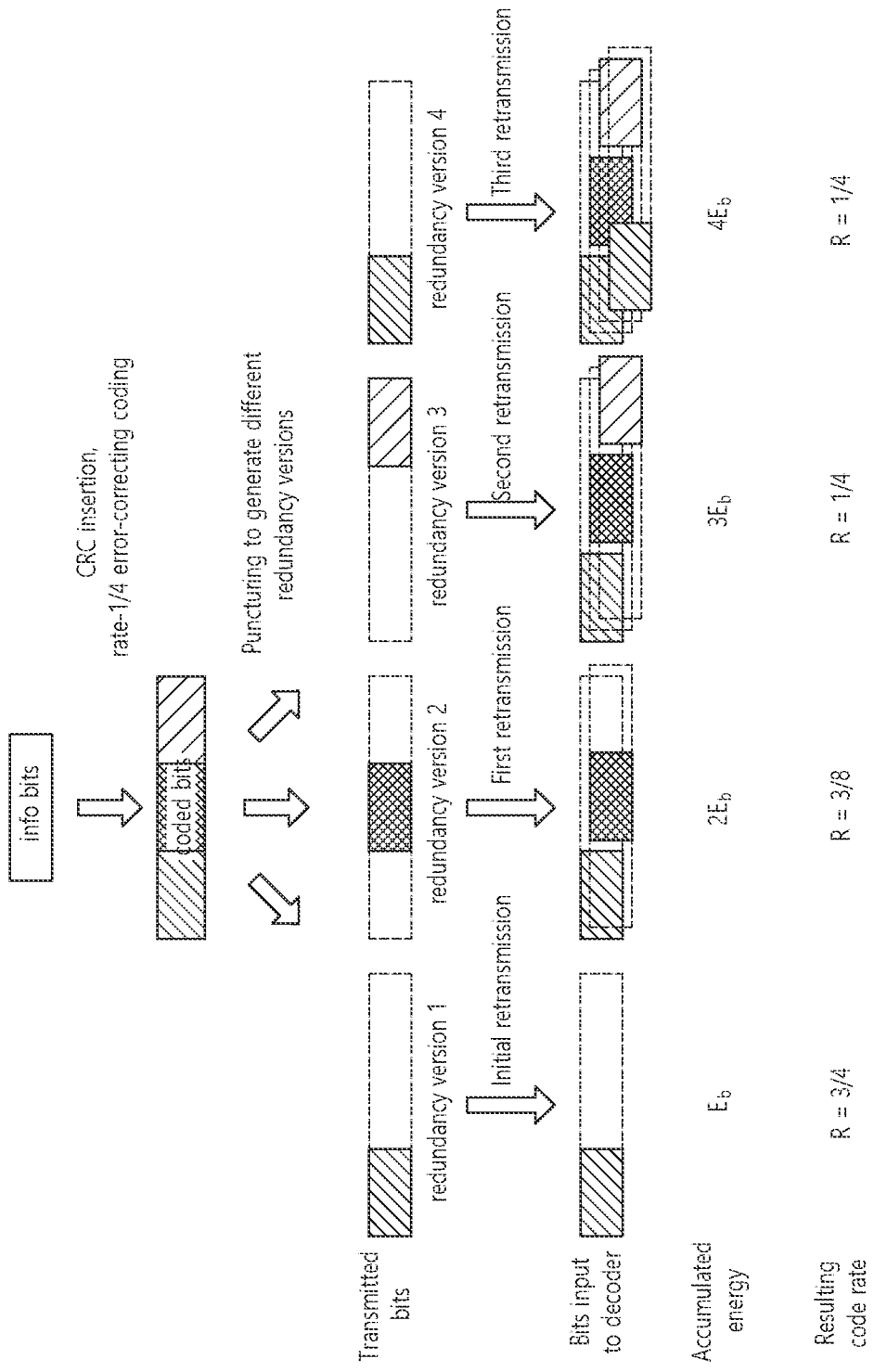
FIG. 25 is a diagram illustrating an example of an incremental redundancy (IR) method.

FIG. 25 is a diagram illustrating an example of an incremental redundancy (IR) method. In the incremental redundancy (IR) method, the coded bits that are initially transmitted and subsequently retransmitted may be different as follows. Accordingly, when the IR method is used, the STA performing retransmission generally delivers the IR version (or packet version/retransmission version) to the receiving STA. In the following drawings, the transmitting STA is an example of performing retransmission in the order of IR version 1→IR Version 2→IR Version 3→IR Version 1. The receiving STA may combine and decode the received packet/signal.

HARQ may have an effect of expanding coverage in a low SNR environment (for example, an environment in which a transmitter and a receiver are far apart). HARQ may have an effect of increasing throughput in a high SNR environment.

According to the basic procedure of HARQ, a transmitter can transmit packets and a receiver can receive packets. The receiver may check whether received packets have errors. The receiver may feedback to the transmitter a request to retransmit erroneous packets among the received packets.

For example, the receiver may transmit a request for retransmission of erroneous packets among packets received through the ACK/NACK frame or the Block ACK frame. The transmitter may receive feedback from the receiver and may retransmit erroneous packets based on the feedback. For another example, the transmitter may transmit erroneous packets and new packets together. Packets that do not generate errors may not be retransmitted.

The receiver may perform decoding by combining previously received erroneous packets and retransmitted packets. A method of combining packets includes a method of combining in a modulation symbol unit (for example, BPSK, QPSK, 16QAM, 64QAM, 256QAM, 1024QAM, etc.) and a method of combining in a log likelihood ratio (LLR) value unit after a de-mapper. Hereinafter, a method of combining in LLR value units may be assumed. If decoding is performed by combining the previously received packet and the retransmitted packet, but an error occurs, the above procedure can be repeated as many as the predetermined maximum number of retransmissions.

Figure 26:
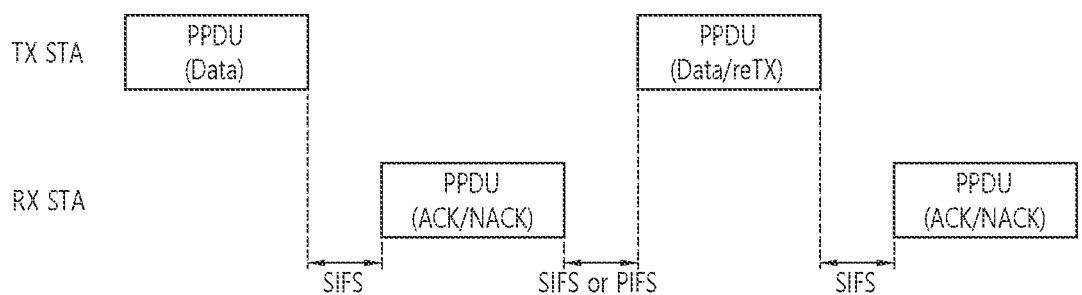
FIG. 26 is a diagram for explaining the operation of HARQ.

FIG. 26 is a diagram for explaining the operation of HARQ.

Referring to FIG. 26, a transmitting STA (for example, the first STA 110) may transmit a PPDU to a receiving STA (for example, the second STA 120). The PPDU may include data. The receiving STA may decode the received PPDU. After decoding the PPDU, the receiving STA may check whether there is an error in the PPDU by using a Frame Check Sequence (FCS) (or Cyclic Redundancy Check (CRC)).

When there is no error in the PPDU, the receiving STA may transmit an ACK frame to the transmitting STA after a specified time (for example, SIFS). In other words, the receiving STA may transmit an ACK frame to the transmitting STA after a specified time based on the absence of an error in the PPDU.

When there is an error in the PPDU, the receiving STA may transmit a NACK frame to the transmitting STA after a specified time (for example, SIFS). In other words, the receiving STA may transmit a NACK frame to the transmitting STA after a specified time based on an error in the PPDU. When the receiving STA transmits a NACK frame to the transmitting STA, the receiving STA may store an error packet (for example, a PPDU or a data field) in the PHY layer. In other words, the receiving STA may store the packet with an error through the PHY layer based on the NACK frame.

The transmitting STA may transmit (or retransmit) a packet (or PPDU) reported as having an error after a specified time (for example, SIFS, PIFS, or DIFS). In addition, the transmitting STA may transmit (or retransmit) a packet (or PPDU) reported as having an error when the backoff count value becomes {0} after performing contention. According to an embodiment, the transmitting STA may additionally transmit a new packet together with the packet reported as having an error.

Thereafter, the receiving STA may receive the packet reported as having an error. The receiving STA may perform decoding after combining the stored packet with the re-received packet. The receiving STA may determine whether there is an error in the received re-received packet through decoding. In this case, the receiving STA may determine whether there is an error between the stored packet and the re-received packet.

The receiving STA may transmit the re-received packet to the MAC layer when there is no error in the re-received packet. If there is an error in the re-received packet, the receiving STA may again transmit a NACK frame to the transmitting STA and repeat the above-described procedure. In other words, the receiving STA may transmit the received packet to the MAC layer on the basis that there is no error in the received packet. The receiving STA may transmit a NACK frame again to the transmitting STA based on an error in the received packet, and repeat the above-described procedure.

In order to support HARQ by the transmitting STA and the receiving STA, a unit of retransmission must be defined. Hereinafter, a criterion for determining whether a packet has an error or a unit for retransmission may be defined as a HARQ unit. For example, the HARQ unit may include a Low Density Parity Check Code (LDPC) codeword (CW) or an MPDU. As an example, when the transmitting STA uses LDPC for encoding, the HARQ unit may be set in units of LDPC CW.

According to an embodiment, the HARQ unit may be referred to by various terms. For example, the HARQ unit may be referred to as a data block, unit, HARQ transmission unit, or etc. Hereinafter, for convenience of description, the HARQ unit may be described as LDPC CW, which is an example of the HARQ unit. Also, LDPC CW may be referred to by various terms. For example, the LDPC CW may also be referred to as a codeword (CW). Hereinafter, for convenience of description, the LDPC CW may be described as a codeword.

The receiving STA may perform a check-sum on the codewords in the received PPDU. The receiving STA may indirectly determine whether there is an error in the code word through a check-sum. The check-sum process may be performed based on whether Equation 1 is satisfied.

$$H \times c^T = 0 \quad \text{[Equation 1]}$$

Referring to Equation 1, H may mean a parity check matrix. c may mean a codeword.

Thereafter, the receiving STA may feedback to the transmitting STA on the presence or absence of errors in the codewords. The receiving STA may perform retransmission in units of codewords based on the received feedback information. In addition, in order to determine whether there is an error in the codeword, the transmitting STA may additionally allocate error check bits such as Frame Check Sequence (FCS) (or Cyclic Redundancy Check (CRC)). The receiving STA may determine whether there is an error in the codeword based on the error check bits.

1. Encoding Procedure Including CRC Bits (or Blocks)

Hereinafter, an encoding method for determining the presence or absence of an error using the CRC instead of the check-sum may be proposed. When CRC is used to determine whether there is an error, additional bits may be required than when check-sum is used. However, when CRC is used, there is a stronger effect on a false alarm than when check-sum is used. That is, when CRC is used, the reliability is higher than when check-sum is used. Hereinafter, when CRC is used, an example of an operation of a transmitting STA that performs encoding and transmits the encoded data may be described.

The transmitting STA may configure a plurality of blocks for encoding. For example, the plurality of blocks may include a first block and a second block. The second block may be contiguous with the first block.

The first block may include a first data block and a first CRC block. The first CRC block may include information for determining whether there is an error in the first data block. The first CRC block may be contiguous to the first data block.

The second block may include a second data block and a second CRC block. The second CRC block may include information for determining whether there is an error in the second data block. The second CRC block may be contiguous to the second data block.

For example, each of the first CRC block and the second CRC block may be set to 16 bits.

For example, the plurality of blocks may include an MPDU and a service field.

The transmitting STA may encode each of the plurality of blocks. For example, the transmitting STA may encode each of a plurality of blocks through an LDPC encoder. In other words, the transmitting STA may LDPC-encode the plurality of blocks, respectively. For example, the transmitting STA may encode a first block including the first data block and the first CRC block through the LDPC encoder. In addition, the transmitting STA may encode the second block including the second data block and the second CRC block through the LDPC encoder. The transmitting STA may transmit the encoded plurality of blocks. For example, the transmitting STA may transmit the plurality of the LDPC encoded blocks.

Another example of the operation of the above-described transmitting STA may be described below.

The transmitting STA may determine the first number of codewords based on the data to be transmitted. For example, the transmitting STA may identify the length of data to be transmitted. The transmitting STA may determine the first number of codewords based on the length of data to be transmitted. The first number of codewords may be referred to as $N_{CW\_temp}$.

The transmitting STA may determine at least one block for CRC (or at least one CRC block) based on the first number of codewords. For example, the transmitting STA may add a block for CRC per codeword. Accordingly, the transmitting STA may add blocks for the same number of CRCs as the first number of codewords. For another example, the transmitting STA may add a block for CRC every two or more codewords. For example, when a block for CRC is added every two codewords, a block for CRC may be added in half the first number. The block for one CRC may be set to 16 bits.

The transmitting STA may determine the second number of codewords based on at least one block for CRC. By adding at least one block for CRC, the length of data to be encoded may be increased. Accordingly, the transmitting STA may determine the second number of codewords based on at least one block for CRC. The second number of codewords may be referred to as $N_{CW}$.

The transmitting STA may encode the data based on the second number of codewords and the at least one block for CRC. For example, the transmitting STA may LDPC encode the data.

For example, the transmitting STA may compare the first number of codewords with the second number of codewords. For example, when the first number of codewords and the second number of codewords match, the transmitting STA may LDPC-encode at least one block for data and CRC. For other example, when the first number of codewords and the second number of codewords are different, the transmitting STA may re-determine at least one block for CRC. The transmitting STA may re-determine at least one block for CRC based on the second number of codewords. The transmitting STA may determine the third number of codewords based on the at least one block for the re-determined CRC. When the second number of codewords and the third number of codewords match, the transmitting STA may LDPC-encode the data and at least one block for the re-determined CRC. Thereafter, the transmitting STA may transmit the encoded data.

Hereinafter, a specific example of the above-described embodiment may be described.

Figure 27:
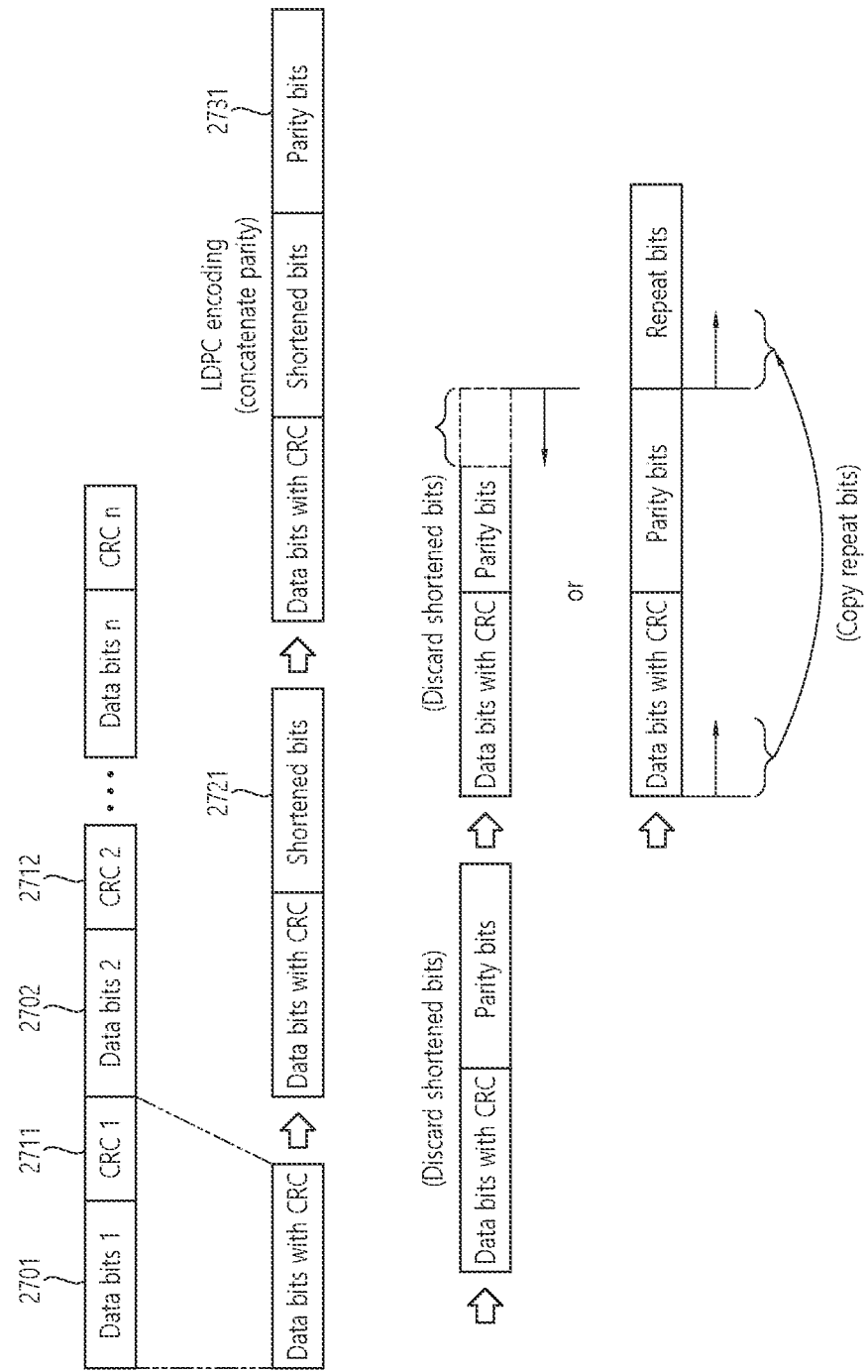
FIG. 27 shows an example of an LDPC encoding procedure including a CRC bit.

FIG. 27 shows an example of an LDPC encoding procedure including a CRC bit.

Referring to FIG. 27, a transmitting STA may configure a plurality of data blocks and a plurality of CRC blocks. The plurality of data blocks may include Data bits1 2701 and Data bits2 2702. Also, the plurality of CRC blocks may include CRC1 2711 and CRC2 2712.

Each of the plurality of data blocks may be divided into a length corresponding to one LDPC codeword. In other words, the plurality of data blocks may each be associated with one LPDC codeword.

The plurality of CRC blocks may be determined/calculated through each of the plurality of data blocks. For example, CRC1 2711 may be determined/calculated based on Data bits1 2701. For other example, CRC2 2712 may be determined/calculated based on Data bits2 2702.

In other words, the plurality of CRC blocks may be used to determine the presence or absence of errors in each of the plurality of data blocks. For example, CRC1 2711 may include information on whether or not there is an error in Data bits1 2701. For other example, the CRC2 2712 may include information regarding the presence or absence of an error in the data bits2 2702. That is, the receiving STA may determine whether there is an error in the data bits1 2701 based on CRC1 2711. The receiving STA may determine whether there is an error in the data bits2 2702 based on the CRC2 2712.

The transmitting STA may add shortened bits 2721 to Data bits1 2701 and CRC1 2711. The transmitting STA may encode Data bits1 2701, CRC1 2711, and shortened bits 2721 through the LDPC encoder. In other words, the transmitting STA may LDPC-encode Data bits1 2701, CRC1 2711, and shortened bits 2721. Parity bits 2731 may be added to Data bits 2701, CRC1 2711, and shortened bits 2721 through the LDPC encoding. The transmitting STA may generate a signal to transmit by puncturing at least a portion of the parity bits 2731 or adding at least a portion of Data bits 2701 and CRC1 2711. The transmitting STA may transmit the generated signal to the receiving STA. A specific encoding method of the above-described process may be described later.

Figure 28:
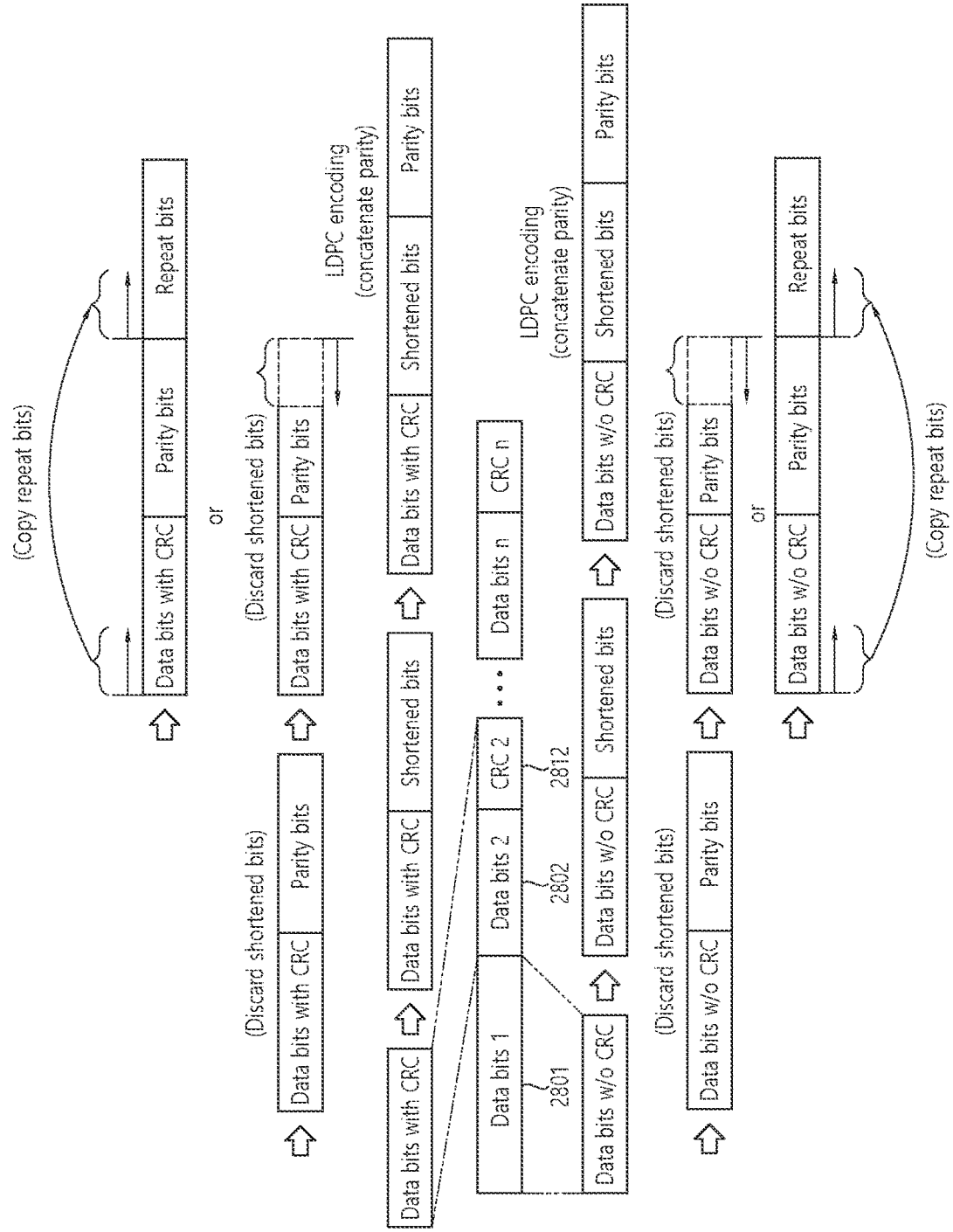
FIG. 28 shows another example of an LDPC encoding procedure including CRC bits.

FIG. 28 shows another example of an LDPC encoding procedure including CRC bits.

Referring to FIG. 28, a transmitting STA may configure a plurality of data blocks and a plurality of CRC blocks. The plurality of data blocks may include Data bits1 2801 and Data bits2 2802.

Each of the plurality of CRC blocks may be determined/calculated through two data blocks. For example, CRC2 2812 may be determined/calculated based on Data bits1 2801 and Data bits2 2802.

In other words, the plurality of CRC blocks may be used to determine the presence or absence of errors in each of the plurality of data blocks. For example, CRC2 2812 may include information on whether there are errors in Data bits1 2801 and Data bits2 2802. That is, the receiving STA may determine whether there are errors in Data bits1 2801 and Data bits2 2802 based on CRC2 2812.

The transmitting STA may encode Data bits1 2801. For example, the transmitting STA may encode Data bits1 2801 through the LDPC encoder. A procedure for encoding data bits1 2801 may refer to FIG. 27.

The transmitting STA may encode Data bits2 2802 and CRC2 2812. For example, the transmitting STA may encode Data bits2 2802 and CRC2 2812 through an LDPC encoder. A procedure for encoding Data bits2 2802 and CRC2 2812 may refer to FIG. 27.

As shown in FIGS. 26 and 27 above, in order to perform encoding, the length of the entire PSDU and parameters for encoding (for example, LDPC encoding) needs to be changed, based on the number of bits of the CRC (or CRC block), the number of codewords, and/or how many codewords the CRC is inserted.

In other words, the length of the PSDU may be changed, for example, based on the number of bits of the CRC. A parameter for encoding needs to be changed based on the number of bits of the CRC. For other example, the length of the PSDU may be changed based on the number of codewords. A parameter for encoding needs to be changed based on the number of codewords. For another example, the length of the PSDU may be changed based on the period of the codeword into which the CRC is inserted. A parameter for encoding needs to be changed based on the period of the codeword into which the CRC is inserted.

Hereinafter, a method for determining parameters for encoding (for example, LDPC encoding) when CRC is inserted may be described.

A method of generating CRC bits (or CRC blocks) may be set in various ways. For example, the CRC bit (or CRC block) may be generated by using CRC-16-CCITT($x^{16}$+ $x^{12}$+$x^5$+1). For other example, in order to generate a CRC bit (or a CRC block), a method using a different polynomial may be applied. For another example, a method of generating another number of CRC bits may be applied.

Hereinafter, LDPC encoding, which is an example of an encoding scheme, may be described. First, a conventional LDPC encoding procedure will be described, and when a CRC block is inserted, specific examples of newly set LDPC encoding equations and parameters may be described.

In the conventional WLAN system, the following procedure may be performed for LDPC encoding.

2. Conventional LDPC Encoding Procedure

The LDPC encoding procedure of the conventional 802.11 standard may be performed based on the following steps (a) to (g).

(a) Computing the number of available bits (that is, $N_{avbits}$) in the minimum number of OFDM symbols in which the Data field of the packet may fit.

(b) Computing the integer number of LDPC codewords to be transmitted and the length of the codewords to be used;

(c) Before encoding, computing the number of shortening bits to be padded to data bits (d) Calculating the number of bits to be punctured in the codeword after encoding (e) Calculating the number of coded bits to be repeated (f) For each codeword, processing the data using the number of shortening bits per codeword calculated in step (c), and puncturing or repeating bits per codeword calculated in steps (d), (e)

(g) Aggregating and parsing all codewords

Accordingly, the transmitting STA may perform LDPC encoding based on steps (a) to (g). Thereafter, the transmitting STA may transmit the PPDU to the receiving STA based on the LDPC encoding. The receiving STA may perform a check-sum process on CWs in the received PPDU. For example, the check-sum process may be performed based on whether Equation 1 described above is satisfied.

3. Newly Set LDPC Encoding Equations and Parameters (1) LDPC Code Rate (or Coding Rates) and Length of Codeword Block for ARQ and HARQ According to an embodiment, code rates (or coding rates), information block lengths, and/or codeword block lengths may be shown in Tables 5 and 6.

TABLE 5

| Coding rate (R) | LDPC information block length (bits) | LDPC codeword block length (bits) |
|---|---|---|
| 1/2 | 972 | 1944 |
| 1/2 | 648 | 1296 |
| 1/2 | 324 | 648 |
| 2/3 | 1296 | 1944 |
| 2/3 | 864 | 1296 |
| 2/3 | 432 | 648 |
| 3/4 | 1458 | 1944 |
| 3/4 | 972 | 1296 |

TABLE 6

| Coding rate (R) | LDPC information block length (bits) | LDPC codeword block length (bits) |
|---|---|---|
| 3/4 | 486 | 648 |
| 5/6 | 1620 | 1944 |
| 5/6 | 1080 | 1296 |
| 5/6 | 540 | 648 |

(2) LDPC Encoder for ARQ and HARQ

For each of the three possible codeword block lengths, the LDPC encoder may support encoding of rates of 1/2, 2/3, 3/4, and/or 5/6. The LDPC encoder may be systematic. For example, the LDPC encoder (that is, transmitting STA) may generate a codeword (that is, $c=(i_0, i_1 \ldots i_{k-1}, p_0, p_1, \ldots, p_{(n-k-1)})$ of size n by encoding an information block (that is, $c=(i_0, i_1 \ldots i_{(k-1)})$ of size k.

The LDPC encoder may generate a codeword by adding (n-k) parity bits to satisfy Equation (1) described above. In Equation 1 described above, H may be a parity check matrix of (n-k)×n. The selection of the codeword block length (that is, n) may be established/achieved via the LDPC encoding process described below. The information block may include CRC bits (or CRC block) when HARQ is applied.

(3) Parity Check Matrix for ARQ and HARQ

According to an embodiment, each parity check matrix may be divided into square sub-blocks. The square sub-block may be set to a size of Z×Z. The square sub-blocks may include cyclic-permutations of an identity matrix or a null sub-matrix. The cyclic-permutation matrix (that is, $P_i$) can be obtained by periodically shifting the identity matrix to the right by i elements. $P_0$ may mean an identity matrix of Z×Z.

FIGS. 29 to 31 show examples of sub-blocks constituting a parity check matrix.

Referring to FIGS. 29 to 31, the parity check matrix may be divided into square sub-blocks. The sub-block may include a cyclic-permutation matrix. Here, the cyclic-permutation matrix may be set to a size of Z×Z. For example, Z may be set to 8.

Referring to FIG. 29, a cyclic permutation matrix (that is, $P_0$) may be illustrated.

Referring to FIG. 30, a cyclic permutation matrix (that is, $P_1$) may be illustrated.

Referring to FIG. 31, a cyclic permutation matrix (that is, $P_5$) may be illustrated.

Based on the aforementioned cyclic-permutation matrices, a parity check matrix may be constructed. An example of a parity check matrix may be described below.

FIG. 32 is a diagram for explaining an example of a parity check matrix.

Referring to FIG. 32, a parity check matrix may be set in various ways. FIG. 32 shows matrix prototypes in the case where the block length (that is, n) of the codeword is 648 bits. In this case, the size (that is, Z) of the sub-block may be 27 bits. An integer (for example, i) illustrated in FIG. 32 may mean a cyclic permutation matrix (for example, $P_i$). An empty element shown in FIG. 32 may mean a null sub-matrix.

According to an embodiment, a parity check matrix may be set differently based on a code rate. FIG. 32 may be an example of a parity check matrix when the code rate is 1/2, 2/3, 3/4, or 5/6.

Although not shown, the parity check matrix may be set in various ways. For example, the parity check matrix may be set based on the block length (that is, n) of the codeword. For example, the block length (that is, n) of the codeword may be set to 1296 bits or 1944 bits. In this case, the size (that is, Z) of the sub-block may be set to 54 bits or 81 bits.

(4) LDPC PPDU Encoding Process for HARQ

The transmitting STA may perform steps a) to i) to encode the LDPC PPDU.

a) Calculating an Integer Number of LDPC Codewords to be Transmitted

The integer number of LDPC codewords to be transmitted (that is, $N_{CW\_temp}$) may be calculated/set as shown in Table 7.

TABLE 7

| | Number of LDPC codewords ($N_{CW\_temp}$) |
|---|---|
| $\left(N_{CBPS} \times m_{STBC} \times \left\lceil \dfrac{N_{pld\_temp} + \text{the number of } CRC \text{ bits}}{N_{CBPS} \times R \times m_{STBC}} \right\rceil\right) \leq 648$ | 1 |
| $648 < \left(N_{CBPS} \times m_{STBC} \times \left\lceil \dfrac{N_{pld\_temp} + \text{the number of } CRC \text{ bits}}{N_{CBPS} \times R \times m_{STBC}} \right\rceil\right) \leq 1296$ | 1 |
| $1296 < \left(N_{CBPS} \times m_{STBC} \times \left\lceil \dfrac{N_{pld\_temp} + \text{the number of } CRC \text{ bits}}{N_{CBPS} \times R \times m_{STBC}} \right\rceil\right) \leq 1944$ | 1 |
| $1944 < \left(N_{CBPS} \times m_{STBC} \times \left\lceil \dfrac{N_{pld\_temp} + 2 \times \text{the number of } CRC \text{ bits}}{N_{CBPS} \times R \times m_{STBC}} \right\rceil\right) \leq 2592$ | 2 |
| $2592 < \left(N_{CBPS} \times m_{STBC} \times \left\lceil \dfrac{N_{pld\_temp} + 2 \times \text{the number of } CRC \text{ bits}}{N_{CBPS} \times R \times m_{STBC}} \right\rceil\right)$ | $\left\lceil \dfrac{N_{pld_{temp}} + \left(\left\lceil \dfrac{N_{pld\_temp}}{1944 \cdot R} \right\rceil\right) \times \text{the number of } CRC \text{ bits}}{1944 \cdot R} \right\rceil$ |

Referring to Table 7, $m_{STBC}$ may be set to 2 when space-time block coding (STBC) is used. $m_{STBC}$ may be set to 1 when STBC is not used. $N_{CBPS}$ may mean the number of coded bits per OFDM symbol. R may mean a code rate (or coding rate). As described above, R may be defined as a value specified as a primitive of TXVECTOR. $N_{pld\_temp}$ may mean the number of bits included in the PSDU and the service field. $N_{pld\_temp}$ may be set as in Equation 2. The operation $\lceil x \rceil$ may mean ceil(x). The operation $\lceil x \rceil$ may mean the smallest integer greater than or equal to x.

$$N_{pld\_temp} = \text{length} \times 8 + 16 \qquad \text{[Equation 2]}$$

Referring to Equation 2, length may mean a value of the length field of the SIG field (for example, EHT-SIG or HT-SIG).

b) Computing the number of available bits (that is, $N_{avbits}$) in the minimum number of OFDM symbols in which the Data field of the packet may fit.

Hereinafter, an example in which CRC bits (or CRC block) is set to 16 bits may be described. In addition, an example in which CRC bits are added for each one codeword may be described.

Accordingly, when CRC bits are added to each codeword and set to 16 bits, the PSDU, the number of bits included in the service field, and the total number of CRC bits (that is, $N_{pld}$) may be set as in Equation 3. In addition, the number of available bits (that is $N_{avbits}$) included in the minimum number of OFDM symbols that can be included in the data field of the packet may be set as in Equation 3.

$$N_{pld} = (\text{length} \times 8) + 16 + (N_{CW\_temp} \times 16) \qquad \text{[Equation 3]}$$

$$N_{avbits} = N_{CBPS} \times m_{STBC} \times \left\lceil \dfrac{N_{pld}}{N_{CBPS} \times R \times m_{STBC}} \right\rceil$$

Referring to Equation 3, $N_{pld}$ may be a value obtained by adding the total number of bits of CRC bits (or CRC blocks) to the number of bits included in the PSDU and the service field. In Equation 3, CRC bits may be set equal to the number of codewords, and the number of bits of each CRC bits may be set to 16 bits. Accordingly, a value obtained by multiplying $N_{pld\_temp}$ may be added to the number of bits included in the PSDU and service field.

Unlike Equation 3, CRC bits (or CRC blocks) may be added to every two or more codewords. For example, CRC bits (or CRC block) may be added to every 4 codewords. When CRC bits (or CRC blocks) are added to every four codewords, $N_{pld}$ may be set as in Equation 4.

$$N_{pld} = (\text{length} \times 8) + 16 + \left(\left\lceil \dfrac{N_{CW\_temp}}{4} \right\rceil \times 16\right) \qquad \text{[Equation 4]}$$

According to an embodiment, a method of calculating $N_{avbits}$ may be calculated/set in a different manner from the above-described example. As in the above-described example, a method of updating the length value may be used instead of the method of updating the number of bits of the PSDU.

For example, a length value may be set as in Equation 5.

$$\text{length} = \text{length}_{temp} + N_{CW\_temp} \times 2 \qquad \text{[Equation 5]}$$

In addition, CRC bits may be added to every two or more codewords. In the following example, when CRC bits are added to every four codewords, length, $N_{pld}$, and $N_{avbits}$ may be set as in Equation 6.

$$\text{length} = \text{length}_{temp} + \left\lceil \dfrac{N_{CW\_temp} \times 2}{4} \right\rceil \qquad \text{[Equation 6]}$$

$$N_{pld} = (\text{length} \times 8) + 16$$

$$N_{avbits} = N_{CBPS} \times m_{STBC} \times \left\lceil \dfrac{N_{pld}}{N_{CBPS} \times R \times m_{STBC}} \right\rceil$$

In the above-described examples, when CRC bits are added to every two or more codewords, even when the number of last codewords is smaller than a specific number, CRC bits may be added to the last codeword. For this purpose, the $\lceil x \rceil$ operation is used in the above-described equations (Equations 2 to 6). In addition, CRC bits added to every two or more codewords may be determined/calculated based on codewords related to the CRC bits.

c) Calculating the integer number of LDPC codewords to be transmitted (that is, $N_{CW}$) and the length of the codewords to be used (that is, $L_{LDPC}$);

According to an embodiment, the integer number of LDPC codewords to be transmitted (that is, $N_{CW}$) and the length of the codewords to be used (that is, $L_{LDPC}$) may be calculated/set as shown in Table 8.

TABLE 8

| Range of $N_{avbits}$ (bits) | Number of LDPC codewords ($N_{CW}$) | LDPC codeword length $L_{LDPC}$ (bits) |
|---|---|---|
| $N_{avbits} \leq 648$ | 1 | 1296, if $N_{avbits} \geq N_{pld} + 912 \times (1-R)$ 648, otherwise |
| $648 < N_{avbits} \leq 1296$ | 1 | 1944, if $N_{avbits} \geq N_{pld} + 1464 \times (1-R)$ 1296, otherwise |
| $1296 < N_{avbits} \leq 1944$ | 1 | 1944 |
| $1944 < N_{avbits} \leq 2592$ | 2 | 1944, if $N_{avbits} \geq N_{pld} + 2916 \times (1-R)$ 1296, otherwise |
| $2592 < N_{avbits}$ | $\left\lceil \dfrac{N_{pld}}{1944 \cdot R} \right\rceil$ | 1944 |

Referring to Table 8, based on $N_{avbits}$, and $N_{CW}$ and $L_{LDPC}$ may be calculated/set.

d) If the value of $N_{CW}$ is different from the value of $N_{CW\_temp}$, updating the value of $N_{CW\_temp}$ with the value of $N_{CW}$ (that is, $N_{CW\_temp}=N_{CW}$), and performing steps b) and c) again e) Before Encoding, Calculating the Number of Shortening Bits to be Padded to the Data Bits (that is, $N_{shrt}$)

According to an embodiment, $N_{shrt}$ may be calculated/set through Equation 7.

$$N_{shrt}=\max(0,(N_{CW} \times L_{LDPC} \times R)-N_{pld}) \quad \text{[Equation 7]}$$

Referring to Equation 7, $N_{shrt}$ may mean the number of shortening bits. $N_{CW}$ may mean the integer number of LDPC codewords to be transmitted. $L_{LDPC}$ may mean the length of codewords to be used R may mean a code rate (or coding rate). $N_{pld}$ may be a value obtained by adding the total number of bits of CRC bits (or CRC blocks) to the number of bits included in the PSDU and service field.

According to an embodiment, when HARQ is applied, CRC bits (that is, $N_{CRC}$) may be padded to a codeword or codewords before the shortening process. If CRC bits are padded to each codeword, CRC bits can be padded by setting the information bits (that is, $i_{k-NCRC}$-$N_{spcw-1}$, . . . , $i_{k-Nspcw-1}$) to CRC bits within the codewords of the first $N_{shrt}$ mod $N_{CW}$, in the remaining codewords, the information bits (that is, $i_{k-NCR}$-$N_{spcw-1}$, . . . , $i_{k}$-$N_{spcw}$) may be set to CRC bits, so that CRC bits can be padded.

If single CRC bits are padded to multiple codewords, only within the codewords of the first $N_{shrt}$ mod $N_{CW}$ and multiple codewords, the information bit (that is, $i_{k-NCRC}$-$N_{spcw-1}$ . . . , $i_{k}$-$N_{spcw-1}$) may be set to CRC bits so that the CRC bits (that is, $N_{CW\_CRC}$) may be padded. For the remaining codewords, the information bits (that is, $i_{k-NCRC}$-$N_{spcw}$, . . . , $i_{k}$-$N_{spcw}$) are set to CRC bits only within a plurality of codewords, so that CRC bits can be padded. CRC bits may be padded to the last codewords regardless of the value of $N_{CW\_CRC}$.

f) The number of bits to be punctured in the codeword after encoding (that is, $N_{punc}$) may be calculated/set based on Equation 8.

$$N_{punc}=\max(0,(N_{CW} \times L_{LDPC})-N_{avbits}-N_{shrt}) \quad \text{[Equation 8]}$$

Referring to Equation 8, $N_{punc}$ may mean the number of bits to be punctured in the codeword after encoding. $N_{CW}$ may mean an integer number of LDPC codewords to be transmitted. $L_{LDPC}$ may mean the length of codewords to be used. $N_{avbits}$ may mean the number of available bits in the minimum number of OFDM symbols that can be included in the data field of the packet. $N_{shrt}$ may mean the number of shortening bits.

When puncturing more than a specified ratio occurs, the number of bits to be punctured can be reduced by increasing $N_{avbits}$ and recalculating $N_{punc}$. A specific operation related thereto may be described through Equation 9. When the condition of Equation 9 is satisfied, $N_{avbits}$ and $N_{punc}$ may be recalculated/updated according to Equation 10.

if $((N_{punc}>0.1 \times N_{cw} \times L_{LDPC} \times (2-R)$ and $N_{shrt} < 1.2 \times N_{punc} \times (1-R))$ is true

OR if $(N_{punc}>0.3 \times N_{CW} \times L_{LDPC} \times (1-R))$ is true [Equation 9]

$$N_{avbits}=N_{avbits} N_{CBPS} \times m_{STBC} N_{punc}=\max(0,(N_{CW} \times L_{LDPC})-N_{avbits}-N_{shrt}) \quad \text{[Equation 10]}$$

Referring to Equation 10, $N_{avbits}$ and $N_{punc}$ on the left side of the equal sign may be updated and recalculated. That is, although expressed as an equal sign, this may mean an update that is not equal. For example, in Equation 10, $N_{avbits}$ may mean that it can be newly recalculated/updated as a value obtained by adding a value obtained by multiplying $N_{CBPS}$ and $m_{STBC}$ to the existing $N_{avbits}$.

According to an embodiment, the punctured bits may be equally distributed to all codewords (that is, $N_{CW}$) together with the first ($N_{punc}$ mod $N_{CW}$) codewords punctured by 1 bit more than the remaining codewords. Hereinafter, $N_{ppcw}$ may be newly defined. $N_{ppcw}$ may be defined through Equation 11.

$$N_{ppcw} = \left\lfloor \frac{N_{punc}}{N_{CW}} \right\rfloor \quad \text{[Equation 11]}$$

Referring to Equation 11, the operation $\lfloor x \rfloor$ may mean floor(x). The $\lfloor x \rfloor$ operation may mean a maximum integer less than or equal to x.

In the initial transmission, in the case of $N_{ppcw}>0$, puncturing may be performed after encoding by discarding the parity bits (that is, $p_{n-k}$-$N_{ppcw-1}$, . . . , $p_{n-k-1}$) of the first ($N_{punc}$ mod $N_{cw}$) codewords, and discarding the parity bits (that is, $p_{n-k}$-$N_{ppcw}$, . . . , $p_{n-k-1}$) of the remaining codewords.

According to an embodiment, the number of OFDM symbols transmitted through the PPDU may be set/calculated through Equation 12.

$$N_{SYM}=N_{avbits}/N_{CBPS} \quad \text{[Equation 12]}$$

Referring to Equation 12, the number of OFDM symbols transmitted through the PPDU may be set/calculated through Equation 12. $N_{SYM}$ may mean the number of OFDM symbols transmitted through the PPDU. $N_{avbits}$ may mean the number of available bits in the minimum number of OFDM symbols that may be included in the data field of the packet. $N_{CBPS}$ may mean the number of coded bits per OFDM symbol.

g) Calculating the Number of Coded Bits to be Repeated (that is, $N_{rep}$)

The number of coded bits to be repeated (that is, $N_{rep}$) may be calculated/set through Equation 13.

$$N_{rep}=\max(0,N_{avbits}-N_{CW} \times L_{LDPC} \times (1-R)-N_{pld}) \quad \text{[Equation 13]}$$

Referring to Equation 13, $N_{rep}$ may mean the number of coded bits to be repeated.

According to an embodiment, the number of coded bits to be repeated may be equally distributed to all $N_{CW}$ codewords having one or more bits repeated for the first ($N_{punc}$ mod $N_{cw}$) codewords than the remaining codewords.

Figure 33:
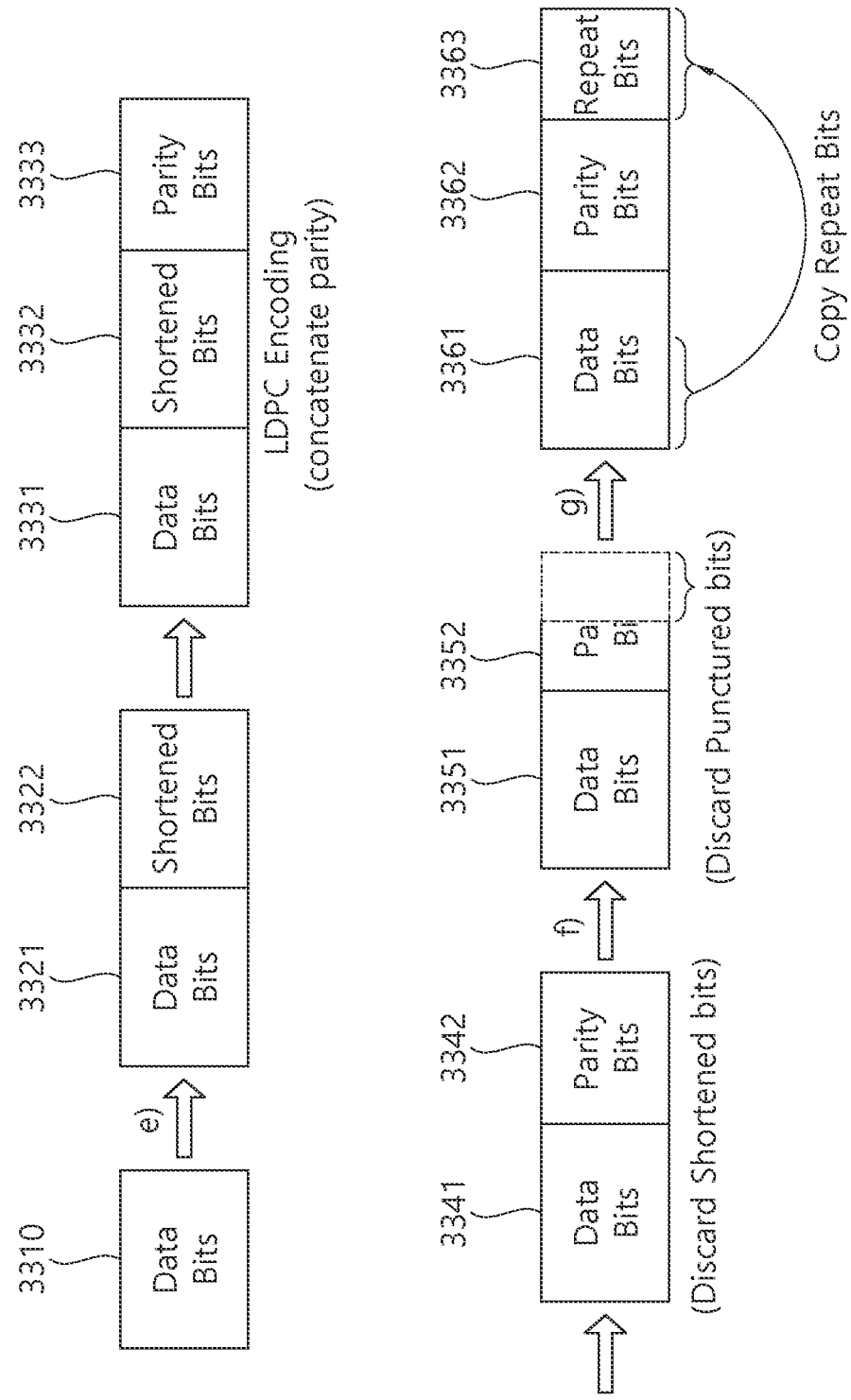
FIG. 33 is a diagram for explaining a padding and puncturing process for one codeword.

FIG. 33 is a diagram for explaining a padding and puncturing process for one codeword.

Referring to FIG. 33, Data Bits 3310 may be converted/changed into Data Bits 3321 and Shortened Bits 3322 based on step e).

Thereafter, it may be changed/converted into Data Bits 3331, Shortened Bits 3332, and Parity Bits 3333 through an LDPC encoding operation.

Thereafter, the Shortened Bits 3332 may be removed. That is, Data Bits 3331, Shortened Bits 3332, and Parity Bits 3333 may be changed/converted into Data Bits 3341 and Parity Bits 3342.

Data Bits 3341 and Parity Bits 3342 may be punctured through step f). Here, some of the Parity Bits 3342 may be punctured. That is, Data Bits 3341 and Parity Bits 3342 may be changed/converted into Data Bits 3351 and Parity Bits 3352.

Through step g), some of the Data Bits 3351 may be copied. Some of the Data Bits 3351 may be Repeat Bits 3363. Data Bits 3351 and Parity Bits 3352 may be changed/converted into Data Bits 3361, Parity Bits 3362, and Repeat Bits 3363. Repeat Bits 3363 may be located after Parity Bits 3362.

h) For Each Codeword, Processing the Data Using the Number of Shortening Bits Per Codeword Calculated in Step e), and Puncturing or Repeating Bits Per Codeword Calculated in Steps f), g)

i) Aggregating and Parsing all Codewords

Accordingly, the transmitting STA may perform LDPC encoding based on steps a) to i) above. Thereafter, the transmitting STA may transmit the PPDU to the receiving STA based on the LDPC encoding. The receiving STA may perform a check-sum process on CWs in the received PPDU.

Figure 34:
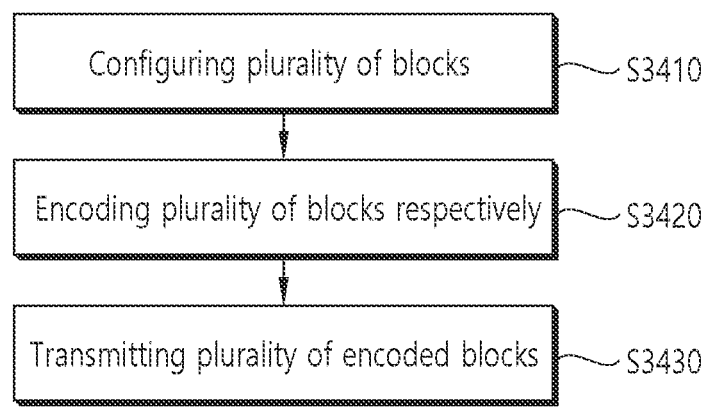
FIG. 34 is a flowchart illustrating an operation of a transmitting STA.

FIG. 34 is a flowchart illustrating an operation of a transmitting STA.

Referring to FIG. 34, in step S3410, a transmitting STA may configure a plurality of blocks. According to an embodiment, the plurality of blocks may include a first block and a second block. The second block may be contiguous with the first block. The plurality of blocks may include an MPDU and a service field.

For example, the first block may include a first data block and a first CRC block. In addition, the second block may include a second data block and a second CRC block. The first CRC block may include information for determining whether there is an error in the first data block. The second CRC block may include information for determining whether there is an error in the second data block.

For example, the first CRC block may be contiguous to the first data block. In addition, the second CRC block may be contiguous to the second data block. For example, the first data block and the second data block may be set to have the same length. For example, each of the first CRC block and the second CRC block may be set to 16 bits.

In step S3420, the transmitting STA may encode a plurality of blocks. According to an embodiment, the transmitting STA may encode a plurality of blocks, respectively. For example, the transmitting STA may encode each of a plurality of blocks through an LDPC encoder. For example, the transmitting STA may encode the first block through an LDPC encoder. In addition, the transmitting STA may encode the second block through the LDPC encoder.

According to an embodiment, the transmitting STA may add shortening bits to each of a plurality of blocks. Thereafter, the transmitting STA may perform LDPC encoding. Based on the LDPC encoding, parity bits may be generated. Thereafter, the transmitting STA may remove shortening bits. According to an embodiment, after the shortening bits are removed, the transmitting STA may puncture at least some of the parity bits. According to an embodiment, after the shortening bits are removed, at least a portion of the plurality of blocks may be added after the parity bits.

According to an embodiment, the first data block may include a first sub-data block and a second sub-data block. The transmitting STA may LDPC-encode the first sub-data block. In addition, the transmitting STA may LDPC-encode the second sub-data block and the first CRC block together.

According to an embodiment, an operation for configuring a plurality of blocks and encoding may be performed in a physical layer of the transmitting STA.

In step S3430, the transmitting STA may transmit the plurality of encoded blocks. According to an embodiment, the transmitting STA may transmit the plurality of encoded blocks to the receiving STA.

Figure 35:
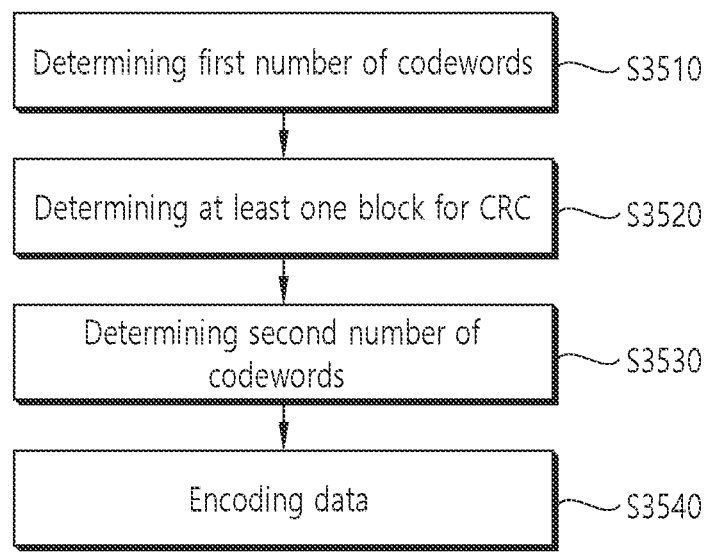
FIG. 35 is a flowchart for explaining another operation of a transmitting STA.

FIG. 35 is a flowchart for explaining another operation of a transmitting STA.

Referring to FIG. 35, in step S3510, the transmitting STA may determine the first number of codewords. According to an embodiment, the transmitting STA may determine the first number of codewords based on data to be transmitted. For example, the data may include an MPDU and a service field.

For example, the transmitting STA may identify the length of data to be transmitted. The transmitting STA may determine the first number of codewords based on the length of data to be transmitted. The first number of codewords may be referred to as $N_{CW\_temp}$.

In step S3520, the transmitting STA may determine at least one block for CRC (or at least one CRC block) based on the first number of codewords.

For example, the transmitting STA may add a block for CRC per codeword. Accordingly, the transmitting STA may add blocks for the same number of CRCs as the first number of codewords.

For another example, the transmitting STA may add a block for CRC every two or more codewords. As an example, when a block for CRC is added every two codewords, a block for CRC may be added in half the first number.

For example, a block for one CRC may be set to 16 bits.

In step S3530, the transmitting STA may determine the second number of codewords based on at least one block for CRC. By adding at least one block for CRC, the length of data to be encoded may be increased. Accordingly, the transmitting STA may determine the second number of codewords based on at least one block for CRC. The second number of codewords may be referred to as $N_{CW}$.

In step S3540, the transmitting STA may encode data based on the second number of codewords and at least one block for CRC. For example, the transmitting STA may LDPC encode the data.

For example, the transmitting STA may compare the first number of codewords with the second number of codewords. For example, when the first number of codewords and the second number of codewords match, the transmitting STA may LDPC-encode at least one block for data and CRC.

For other example, when the first number of codewords and the second number of codewords are different, the transmitting STA may re-determine at least one block for CRC. The transmitting STA may re-determine at least one block for CRC based on the second number of codewords. The transmitting STA may determine the third number of codewords based on the at least one block for the re-determined CRC. When the second number of codewords and the third number of codewords match, the transmitting STA may LDPC-encode the data and at least one block for the re-determined CRC.

After performing encoding, the transmitting STA may transmit the encoded data.

The technical features of the present specification described above may be applied to various devices and methods. For example, the above-described technical features of the present specification may be performed/supported through the apparatus of FIGS. 1 and/or 19. For example, the technical features of the present specification described above may be applied only to a part of FIGS. 1 and/or 19. For example, the technical features of the present specification described above may be implemented based on the processing chips 114 and 124 of FIG. 1, may be implemented based on the processors 111 and 121 and the memories 112 and 122 of FIG. 1, or may be implemented based on the processor 610 and the memory 620 of FIG. 19. For example, the apparatus of the present specification includes a processor and a memory coupled to the processor. The processor may be configured to configure a plurality of blocks. The plurality of blocks may include a first block and a second block. The second block may be contiguous to the first block. The first block may include a first data block and a first CRC block. The second block may include a second data block and a second CRC block. The processor may be configured to encode the plurality of blocks, respectively, and transmit the encoded plurality of blocks.

The technical features of the present specification may be implemented based on a computer readable medium (CRM). For example, the CRM proposed by the present specification may store instructions for performing operations, which includes configuring a plurality of blocks. The plurality of blocks may include a first block and a second block. The second block may be contiguous to the first block. The first block may include a first data block and a first CRC block. The second block may include a second data block and a second CRC block. The operations may include encoding each of the plurality of blocks and transmitting the encoded plurality of blocks. The instructions stored in the CRM of the present specification may be executed by at least one processor. At least one processor related to CRM in the present specification may be the processors 111 and 121 or the processing chips 114 and 124 of FIG. 1, or the processor 610 of FIG. 19. Meanwhile, the CRM of the present specification may be the memories 112 and 122 of FIG. 1, the memory 620 of FIG. 19, or a separate external memory/storage medium/disk.

The foregoing technical features of this specification are applicable to various applications or business models. For example, the foregoing technical features may be applied for wireless communication of a device supporting artificial intelligence (AI).

Artificial intelligence refers to a field of study on artificial intelligence or methodologies for creating artificial intelligence, and machine learning refers to a field of study on methodologies for defining and solving various issues in the area of artificial intelligence. Machine learning is also defined as an algorithm for improving the performance of an operation through steady experiences of the operation.

An artificial neural network (ANN) is a model used in machine learning and may refer to an overall problem-solving model that includes artificial neurons (nodes) forming a network by combining synapses. The artificial neural network may be defined by a pattern of connection between neurons of different layers, a learning process of updating a model parameter, and an activation function generating an output value.

The artificial neural network may include an input layer, an output layer, and optionally one or more hidden layers. Each layer includes one or more neurons, and the artificial neural network may include synapses that connect neurons. In the artificial neural network, each neuron may output a function value of an activation function of input signals input through a synapse, weights, and deviations.

A model parameter refers to a parameter determined through learning and includes a weight of synapse connection and a deviation of a neuron. A hyper-parameter refers to a parameter to be set before learning in a machine learning algorithm and includes a learning rate, the number of iterations, a mini-batch size, and an initialization function.

Learning an artificial neural network may be intended to determine a model parameter for minimizing a loss function. The loss function may be used as an index for determining an optimal model parameter in a process of learning the artificial neural network.

Machine learning may be classified into supervised learning, unsupervised learning, and reinforcement learning.

Supervised learning refers to a method of training an artificial neural network with a label given for training data, wherein the label may indicate a correct answer (or result value) that the artificial neural network needs to infer when the training data is input to the artificial neural network. Unsupervised learning may refer to a method of training an artificial neural network without a label given for training data. Reinforcement learning may refer to a training method for training an agent defined in an environment to choose an action or a sequence of actions to maximize a cumulative reward in each state.

Machine learning implemented with a deep neural network (DNN) including a plurality of hidden layers among artificial neural networks is referred to as deep learning, and deep learning is part of machine learning. Hereinafter, machine learning is construed as including deep learning.

The foregoing technical features may be applied to wireless communication of a robot.

Robots may refer to machinery that automatically process or operate a given task with own ability thereof. In particular, a robot having a function of recognizing an environment and autonomously making a judgment to perform an operation may be referred to as an intelligent robot.

Robots may be classified into industrial, medical, household, military robots and the like according uses or fields. A robot may include an actuator or a driver including a motor to perform various physical operations, such as moving a robot joint. In addition, a movable robot may include a wheel, a brake, a propeller, and the like in a driver to run on the ground or fly in the air through the driver.

The foregoing technical features may be applied to a device supporting extended reality.

Extended reality collectively refers to virtual reality (VR), augmented reality (AR), and mixed reality (MR). VR technology is a computer graphic technology of providing a real-world object and background only in a CG image, AR technology is a computer graphic technology of providing a virtual CG image on a real object image, and MR technology is a computer graphic technology of providing virtual objects mixed and combined with the real world.

MR technology is similar to AR technology in that a real object and a virtual object are displayed together. However, a virtual object is used as a supplement to a real object in AR technology, whereas a virtual object and a real object are used as equal statuses in MR technology.

XR technology may be applied to a head-mount display (HMD), a head-up display (HUD), a mobile phone, a tablet PC, a laptop computer, a desktop computer, a TV, digital signage, and the like. A device to which XR technology is applied may be referred to as an XR device.

The claims recited in the present specification may be combined in a variety of ways. For example, the technical features of the method claims of the present specification may be combined to be implemented as a device, and the technical features of the device claims of the present specification may be combined to be implemented by a method. In addition, the technical characteristics of the method claim of the present specification and the technical characteristics of the device claim may be combined to be implemented as a device, and the technical characteristics of the method claim of the present specification and the technical characteristics of the device claim may be combined to be implemented by a method.

What is claimed is:

1. A method for a transmitting station (STA) in a wireless local area network system, the method comprising:
    configuring a plurality of blocks,
    wherein the plurality of blocks include a first block and a second block,
    wherein the second block is contiguous to the first block,
    wherein the first block includes a first data block and a first Cyclic Redundancy Check (CRC) block, and
    wherein the second block includes a second data block and a second CRC block;
    adding shortening bits to each of the plurality of blocks;
    performing a Low Density Parity Check Code (LDPC) encoding on the plurality of blocks;
    generating parity bits based on the LDPC encoding for the each of the plurality of blocks;
    removing the shortening bits from the each of the plurality of blocks;
    puncturing at least some of the parity bits;
    adding at least a portion of the plurality of blocks after the parity bits; and
    transmitting the encoded plurality of blocks.

2. The method of claim 1,
    wherein the first data block and the second data block are configured to have the same length.

3. The method of claim 1,
    wherein the first CRC block includes information for determining whether there is an error in the first data block, and
    wherein the second CRC block includes information for determining whether there is an error in the second data block.

4. The method of claim 1,
    wherein the first CRC block is contiguous to the first data block, and
    wherein the second CRC block is contiguous to the second data block.

5. The method of claim 1, wherein the encoding each of the plurality of blocks comprises, encoding the each of the plurality of blocks through an LDPC encoder.

6. The method of claim 1, further comprising:
    encoding the first block through an LDPC encoder; and
    encoding the second block through the LDPC encoder.

7. The method of claim 1,
    wherein each of the first CRC block and the second CRC block is configured to 16 bits.

8. The method of claim 1,
    wherein each of the first CRC block and the second CRC block is set to 16 bits.

9. A transmitting station (STA) configured to operate in a wireless local area network (WLAN) system, the transmitting STA comprising:
    a transceiver configured to transmit and receive a radio signal; and
    a processor coupled to the transceiver, wherein the processor is configured to perform operations comprising:
    configuring a plurality of blocks,
    wherein the plurality of blocks include a first block and a second block,
    wherein the second block is contiguous to the first block,
    wherein the first block includes a first data block and a first Cyclic Redundancy Check (CRC) block, and
    wherein the second block includes a second data block and a second CRC block;
    adding shortening bits to each of the plurality of blocks;
    performing a Low Density Parity Check Code (LDPC) encoding on the plurality of blocks;
    generating parity bits based on the LDPC encoding for the each of the plurality of blocks;
    removing the shortening bits from the each of the plurality of blocks;
    puncturing at least some of the parity bits;
    adding at least a portion of the plurality of blocks after the parity bits; and
    transmitting the encoded plurality of blocks.

10. The transmitting STA of claim 9,
    wherein the first data block and the second data block are configured to have the same length.

11. The transmitting STA of claim 9,
    wherein the first CRC block includes information for determining whether there is an error in the first data block, and
    wherein the second CRC block includes information for determining whether there is an error in the second data block.

12. The transmitting STA of claim 9,
    wherein the first CRC block is contiguous to the first data block, and
    wherein the second CRC block is contiguous to the second data block.

13. The transmitting STA of claim 9, wherein the operations include:
    encoding the each of the plurality of blocks through a LDPC encoder.

14. The transmitting STA of claim 9, wherein the operations include:
    encoding the first block through an LDPC encoder; and
    encoding the second block through the LDPC encoder.

15. The transmitting STA of claim 9,
    wherein each of the first CRC block and the second CRC block is set to 16 bits.

16. The transmitting STA of claim 9,
    wherein the plurality of blocks include an MAC protocol data unit (MPDU) and a service field.

17. A device configured to operate in a wireless LAN system, the device comprising:
    a processor; and
    a memory storing instructions and coupled to the processor, wherein the processor is configured to execute the instructions to perform operations comprising:
    configuring a plurality of blocks,
    wherein the plurality of blocks include a first block and a second block,
    wherein the second block is contiguous to the first block, wherein the first block includes a first data block and a first Cyclic Redundancy Check (CRC) block, and
wherein the second block includes a second data block and a second CRC block;
adding shortening bits to each of the plurality of blocks;
performing a Low Density Parity Check Code (LDPC) encoding on the plurality of blocks;
generating parity bits based on the LDPC encoding for the each of the plurality of blocks;
removing the shortening bits from the each of the plurality of blocks;
puncturing at least some of the parity bits;
adding at least a portion of the plurality of blocks after the parity bits; and
transmitting the encoded plurality of blocks.

* * * * *